United States Patent
Liaw

(10) Patent No.: US 12,419,025 B2
(45) Date of Patent: *Sep. 16, 2025

(54) INTEGRATED CIRCUIT STRUCTURE

(71) Applicant: TAIWAN SEMICONDUCTOR MANUFACTURING COMPANY, LTD., Hsinchu (TW)

(72) Inventor: Jhon-Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 178 days.

This patent is subject to a terminal disclaimer.

(21) Appl. No.: 18/228,970

(22) Filed: Aug. 1, 2023

(65) Prior Publication Data

US 2025/0048610 A1    Feb. 6, 2025

(51) Int. Cl.
  *G11C 11/412*    (2006.01)
  *H10B 10/00*    (2023.01)
  *H10D 89/10*    (2025.01)

(52) U.S. Cl.
  CPC ............ *H10B 10/12* (2023.02); *G11C 11/412* (2013.01); *H10B 10/125* (2023.02); *H10D 89/10* (2025.01)

(58) Field of Classification Search
  CPC .... H10B 10/12; H10B 10/125; G11C 11/412; H10D 89/10
  See application file for complete search history.

(56) References Cited

U.S. PATENT DOCUMENTS

| | | | |
|---|---|---|---|
| 9,613,953 B2 | 4/2017 | Liaw | |
| 9,793,273 B2 | 10/2017 | Liaw | |
| 9,805,985 B2 | 10/2017 | Liaw | |
| 10,170,480 B2 | 1/2019 | Liaw | |
| 12,089,391 B2 * | 9/2024 | Liaw | H10B 10/125 |
| 2014/0133218 A1 * | 5/2014 | Liaw | G11C 11/412 |
| | | | 438/283 |
| 2021/0098466 A1 * | 4/2021 | Liaw | H10B 10/12 |
| 2023/0066387 A1 * | 3/2023 | Chen | H10D 30/6735 |
| 2023/0180451 A1 * | 6/2023 | Lin | H10D 84/85 |
| | | | 257/288 |
| 2023/0262951 A1 * | 8/2023 | Liaw | H10B 10/12 |

(Continued)

*Primary Examiner* — Amir Zarabian
*Assistant Examiner* — Justin Bryce Heisterkamp
(74) *Attorney, Agent, or Firm* — Birch, Stewart, Kolasch & Birch, LLP

(57) ABSTRACT

An integrated circuit structure is provided. The integrated circuit structure includes at least one static random-access memory (SRAM) cell. The SRAM cell includes a first active region, a second active region, a first pull-up transistor, a second pull-up transistor, a first isolation transistor, a second isolation transistor, a first pass-gate transistor, a second pass-gate transistor, a first pull-down transistor and a second pull-down transistor. The first active region and the second active region follow a first routing direction. The first pull-up transistor, the second pull-up transistor, the first isolation transistor and the second isolation transistor are formed upon the first active region. The first pass-gate transistor, the second pass-gate transistor the first pull-down transistor and the second pull-down transistor are formed upon the second active region. Each of the at least one SRAM cell has a Y-pitch along the first routing direction. The Y-pitch is 4X contacted poly pitch.

20 Claims, 21 Drawing Sheets

(56) References Cited

U.S. PATENT DOCUMENTS

| | | | |
|---|---|---|---|
| 2024/0008238 A1* | 1/2024 | Liaw | G11C 7/18 |
| 2024/0087646 A1* | 3/2024 | Liaw | G11C 7/18 |
| 2024/0105257 A1* | 3/2024 | Liaw | G11C 11/412 |
| 2024/0357790 A1* | 10/2024 | Liaw | H10D 89/10 |
| 2024/0381609 A1* | 11/2024 | Liaw | H10D 89/10 |

* cited by examiner

INTEGRATED CIRCUIT STRUCTURE

BACKGROUND

Along with the exponential growth of the semiconductor integrated circuit (IC) industry, several generations of ICs have been produced. Each generation has smaller and more complex circuits than the previous generation.

In the IC evolution, the number of interconnected devices per chip area has generally increased while the smallest component (or line) that can be created using a fabrication process has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, multi-gate transistors have been incorporated into memory devices (including, for example, static random-access memory, or SRAM, cells) to reduce chip footprint while maintaining reasonable processing margins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
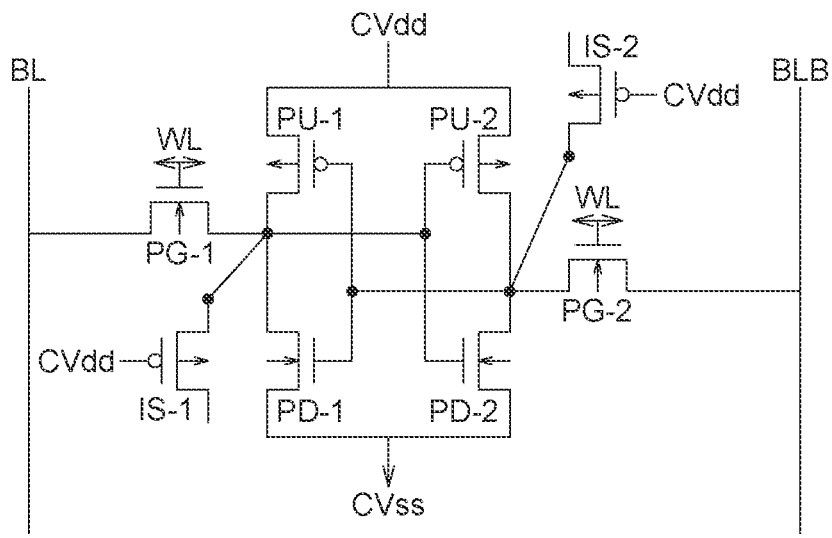
FIG. 1 shows a circuit diagram of a single-port static random-access memory (SRAM) cell according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a circuit diagram of a single-port static random-access memory (SRAM) cell CLi according to one embodiment. The SRAM cell CLi includes a first pass-gate transistor PG-1, a first pull-up transistor PU-1, a first pull-down transistor PD-1, a second pass-gate transistor PG-2, a second pull-up transistor PU-2, a second pull-down transistor PD-2, a first isolation transistor IS-1 and a second isolation transistor IS-2.

A drain node of the first pass-gate transistor PG-1, a drain node of the first pull-up transistor PU-1, a drain node of the first pull-down transistor PD-1, a gate node of the second pull-up transistor PU-2, a gate node of the second pull-down transistor PD-2 and a drain node of the first isolation transistor IS-1 are electrically connected together to form a storage node.

A drain node of the second pass-gate transistor PG-2, a drain node of the second pull-up transistor PU-2, a drain node of the second pull-down transistor PD-2, a gate node of the first pull-up transistor PU-1, a gate node of the first pull-down transistor PD-1 and a drain node of the second isolation transistor IS-2 are electrically connected together to form another storage node.

A source node of the first pass-gate transistor PG-1 is electrically connected to a first bit line BL. A source node of the first pull-up transistor PU-1, a source node of the second pull-up transistor PU-2, a gate node of the first isolation transistor IS-1 and a gate node of the second isolation transistor IS-2 are electrically connected to a power source voltage CVdd. A source node of the first pull-down transistor PD-1 and a second pull-down transistor PD-2 are electrically connected to a common voltage CVss. A source node of the second pass-gate transistor PG-2 is electrically connected to a second bit line BLB. A gate node of the first pass-gate transistor PG-1 and a gate node of the second pass-gate transistor PG-2 are electrically connected to a word line WL.

These transistors are formed by either FinFET transistor or vertically stacked multiple channels gate-all-around (GAA) horizontal nano-sheets transistor.

Figure 2:
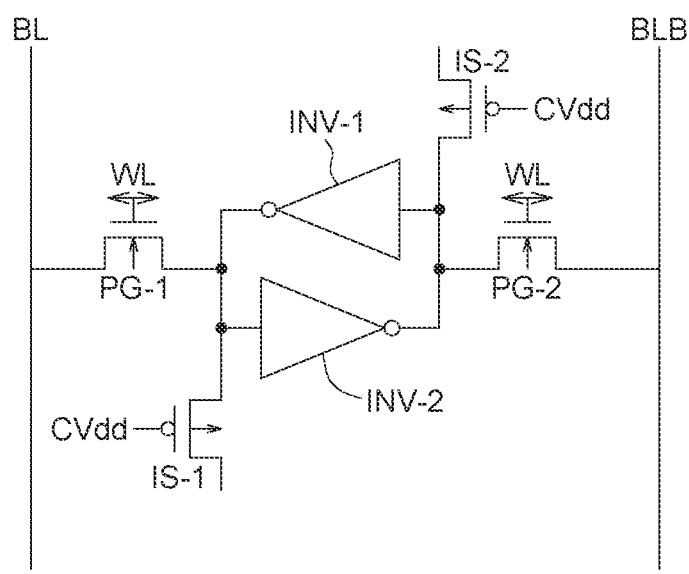
FIG. 2 shows an equivalent circuit diagram of the SRAM cell of FIG. 1.

Please refer to FIG. 2, which shows an equivalent circuit diagram of the SRAM cell CLi of FIG. 1. The first pull-up transistor PU-1 and the first pull-down transistor PD-1 of FIG. 1 form a first inverter INV-1. The second pull-up transistor PU-2 and the second pull-down transistor PD-2 of FIG. 1 form a second inverter INV-2. The first inverter INV-1 and the second inverter INV-2 are cross-coupled.

Figure 3:
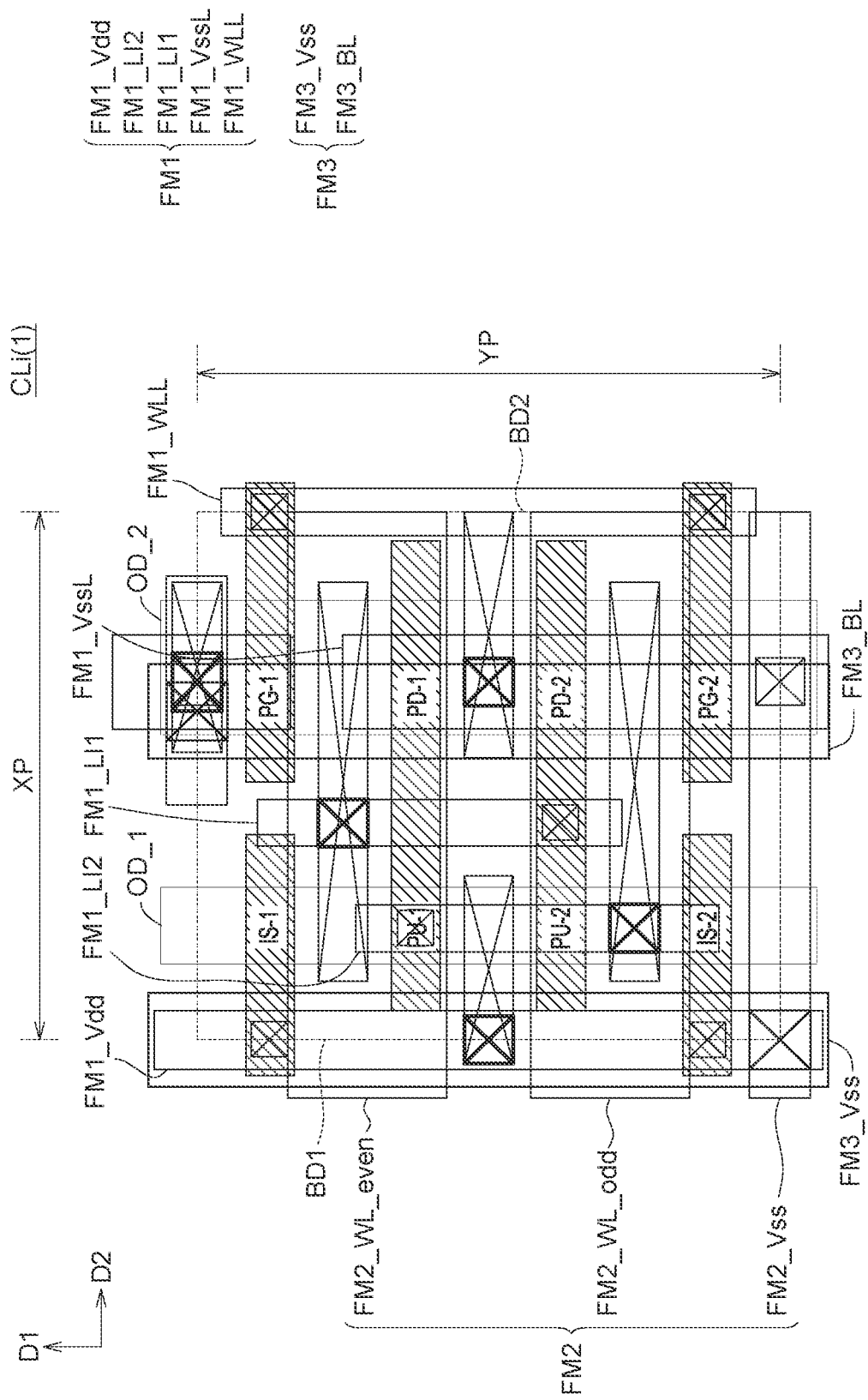
FIG. 3 shows a front-side diagrammatic plan view of an exemplified SRAM cell according to one embodiment.

Please refer to FIG. 3, which shows a front-side diagrammatic plan view of an exemplified SRAM cell CLi(1) according to one embodiment. The SRAM cell CLi(1) includes a first active region OD_1, a second active region OD_2, the first pull-up transistor PU-1, the second pull-up transistor PU-2, the first isolation transistor IS-1, the second isolation transistor IS-2, the first pass-gate transistor PG-1, the second pass-gate transistor PG-2, the first pull-down transistor PD-1 and the second pull-down transistor PD-2.

The first active region OD_1 follows a first routing direction D1. The second active region OD_2 follows the first routing direction D1. The first pull-up transistor PU-1 is formed upon the first active region OD_1. The second pull-up transistor PU-2 is formed upon the first active region OD_1. The first isolation transistor IS-1 is formed upon the first active region OD_1. The second isolation transistor IS-2 is formed upon the first active region OD_1.

The first pass-gate transistor PG-1 is formed upon the second active region OD_2. The second pass-gate transistor PG-2 is formed upon the second active region OD_2. The first pull-down transistor PD-1 is formed upon the second active region OD_2. The second pull-down transistor PD-2 is formed upon the second active region OD_2.

The SRAM cell CLi(1) has a Y-pitch YP along the first routing direction D1. The Y-pitch YP is more than 1X contacted poly pitch (CPP) or 1X transistor gate pitch. For example, The Y-pitch YP is 4X contacted poly pitch (CPP) or 4X transistor gate pitch. The contacted poly pitch (CPP) is the minimum distance between two parallel poly.

The SRAM cell CLi(1) includes a first level front-side metal layer FM1, a second level front-side metal layer FM2 and a third level front-side metal layer FM3. The first level front-side metal layer FM1 includes a power supply voltage conductor FM1_Vdd, a common voltage landing pad FM1_VssL, a word-line landing line FM1_WLL, a first local connection line FM1_LI1 and a second local connection line FM1_LI2. The power supply voltage conductor FM1_Vdd is located at a first boundary BD1 of the SRAM cell CLi(1) and shared with another adjacent SRAM cell CLi(1), and electrically connected to a source node of the first pull-up transistor PU-1 and a source node of the second pull-up transistor PU-2. The common voltage landing pad FM1_VssL is electrically connected to a source node of the first pull-down transistor PU-1 and a source node of the second pull-down transistor PU-2. The word-line landing line FM1_WLL is located at a second boundary BD2 of the SRAM cell CLi(1) and shared with another adjacent SRAM cell CLi(1), and electrically connected to a gate node of the first pass-gate transistor PG-1 and a gate node of the second pass-gate transistor PG-2. The first local connection line FM1_LI1 is used to make an electrical connection among a drain node of the first pull-up transistor PU-1, a drain node of the first pull-down transistor PD-1, a drain node of the first pass-gate transistor PG-1, a gate node of the second pull-up transistor PU-2 and a gate node of the second pull-down transistor PD-2. The second local connection line FM1_LI2 is used to make an electrical connection among a drain node of the second pull-up transistor PU-2, a drain node of the second pull-down transistor PD-2, a drain node of the second pass-gate transistor PG-2, a gate node of the first pull-up transistor PU-1 and a gate node of the first pull-down transistor PD-1.

The second level front-side metal layer FM2 is located upon the first level front-side metal layer FM1. The second level front-side metal layer FM2 includes a first word-line conductor FM2_WL_odd, a second word-line conductor FM2_WL_even and a common voltage conductor FM2_Vss. The first word-line conductor FM2_WL_odd follows a second routing direction D2 substantially perpendicular to the first routing direction D1. The second word-line conductor FM2_WL_even follows the second routing direction D2. The common voltage conductor FM2_Vss follows the second routing direction D2. The common voltage conductor FM2_Vss is electrically connected to the common voltage landing pad FM1_VssL.

The third level front-side metal layer FM3 is located upon the second level front-side metal layer FM2. The third level front-side metal layer FM3 includes a first bit-line conductor FM3_BL and a common voltage conductor FM3_Vss. The first bit-line conductor FM3_BL is electrically connected to a source node of the first pass-gate transistor PG-1. The common voltage conductor FM3_Vss is electrically connected to the second common voltage conductor FM3_Vss. The first bit-line conductor FM3_BL and the common voltage conductor FM3_Vss follow the first routing direction D1.

As shown in FIG. 3, the SRAM cell CLi(1) is rectangular shaped and a ratio of an X-pitch XP to the Y-pitch YP is within a range of 0.7 to 1.5. That is, the X-pitch XP is reduced to shrink the component size.

Figure 4:
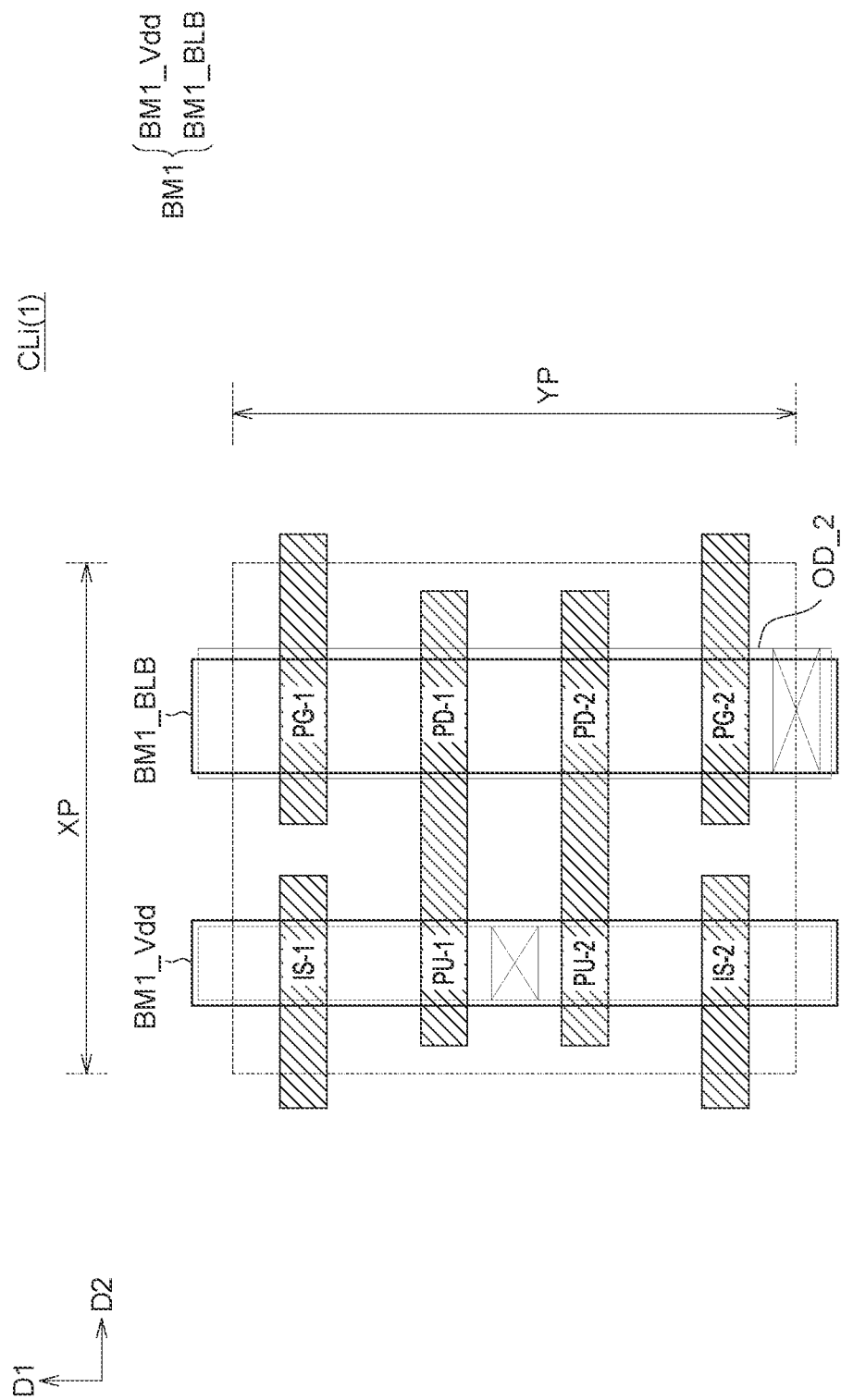
FIG. 4 shows a back-side diagrammatic plan view of the SRAM cell according to one embodiment.

Please refer to FIG. 4, which shows a back-side diagrammatic plan view of the SRAM cell CLi(1) according to one embodiment. The SRAM cell CLi(1) further includes a back-side metal layer BM1. The back-side metal layer BM1 includes a power supply voltage conductor BM1_Vdd and a second bit-line conductor BM1_BLB. The power supply voltage conductor BM1_Vdd is electrically connected to a source node of the first pull-up transistor PU-1 and a source node of the second pull-up transistor PU-2. The second bit-line conductor BM1_BLB is electrically connected to a source node of the second pass-gate transistor PG-2.

The power supply voltage conductor BM1_Vdd and the second bit-line conductor BM1_BLB follow the first routing direction D1.

As shown in FIGS. 3 and 4, the first bit-line conductor FM3_BL is located at the front-side of the SRAM cell CLi(1) and the second bit-line conductor BM1_BLB is located at the back-side of the SRAM cell CLi(1). Therefore, the routing loading as well as the cell size could be reduced. The less metal tracks in the same area (layer) also benefits the metal conductor RC performance. The SRAM cell CLi(1) could have lower resistance with wider width and/or lower capacitance with larger space.

In one SRAM cell CLi(1), 8 transistors, such as the first pull-up transistor PU-1, the second pull-up transistor PU-2, the first isolation transistor IS-1, the second isolation transistor IS-2, the first pass-gate transistor PG-1, the second pass-gate transistor PG-2, the first pull-down transistor PD-1 and the second pull-down transistor PD-2 are formed upon two continuous active regions, such as the first active region OD_1 and the second active region OD_2.

Figure 5:
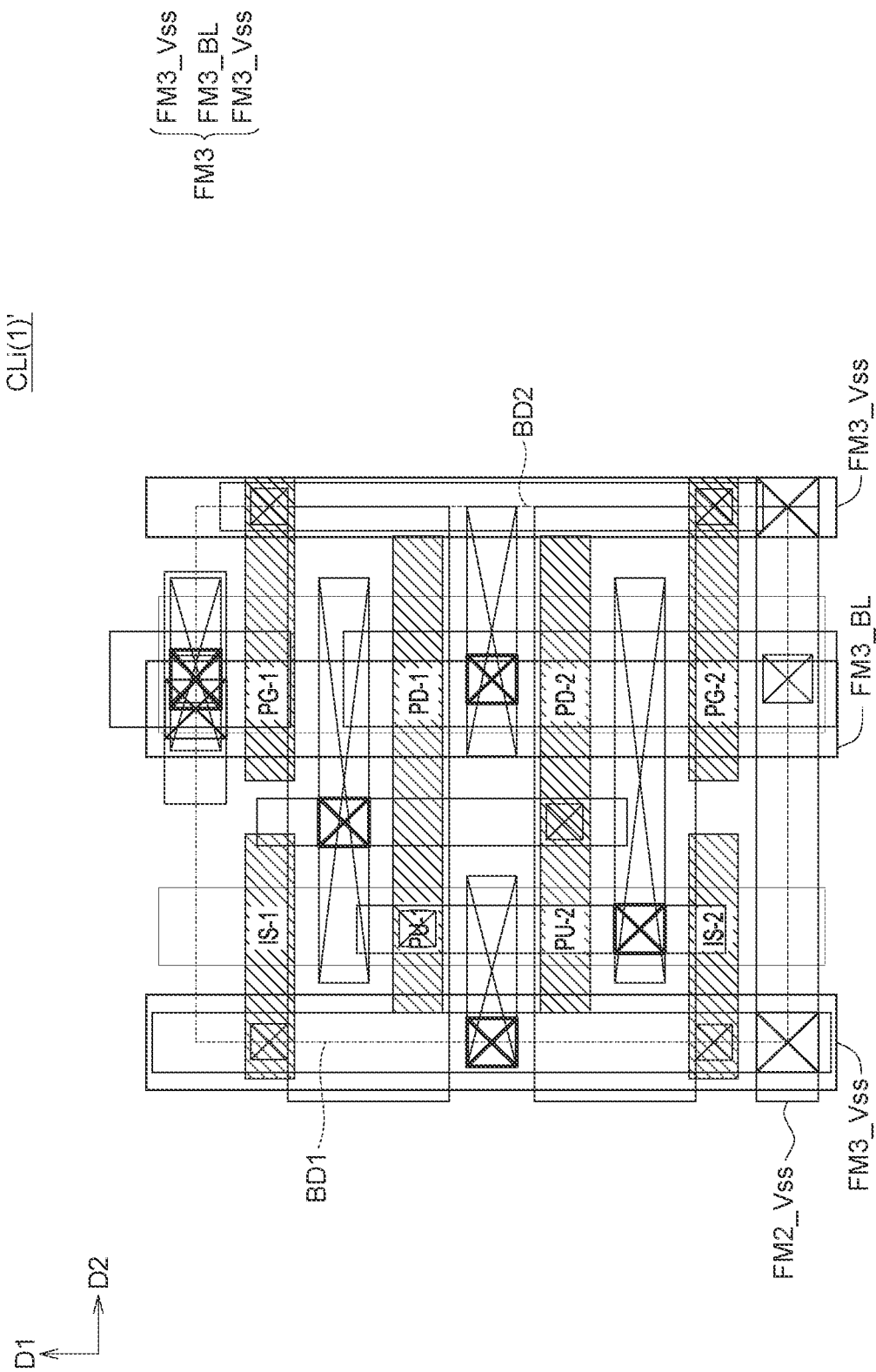
FIG. 5 shows a front-side diagrammatic plan view of an exemplified SRAM cell according to another embodiment.
Figure 6:
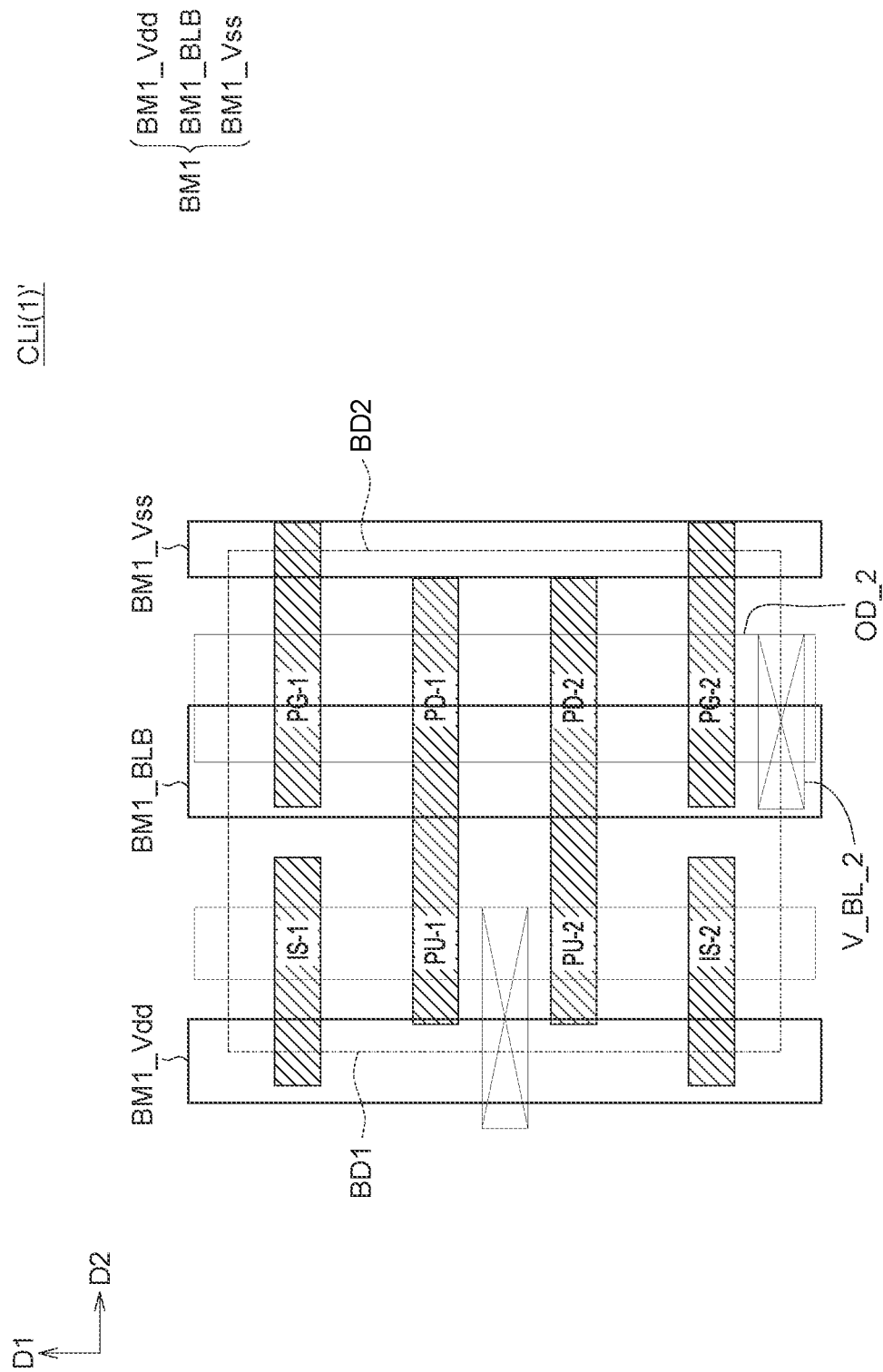
FIG. 6 shows a back-side diagrammatic plan view of the SRAM cell according to another embodiment.

Please refer to FIGS. 5 and 6. FIG. 5 shows a front-side diagrammatic plan view of an exemplified SRAM cell CLi(1)' according to another embodiment. FIG. 6 shows a back-side diagrammatic plan view of the SRAM cell CLi(1)' according to another embodiment. The SRAM cell CLi(1)' is similar to the SRAM cell CLi(1). In the SRAM cell CLi(1)', the third level front-side metal layer FM3 includes two common voltage conductors FM3_Vss. The two common voltage conductors FM3_Vss are located at the first boundary BD1 and the second boundary BD2 respectively and electrically connected to the common voltage conductors FM2_Vss. The back-side metal layer BM1 further includes a common voltage conductors BM1_Vss. The common voltage conductors BM1_Vss is located at the second boundary BD2.

In the SRAM cell CLi(1)' of FIG. 6, the second bit-line conductor BM1_BLB is shifted from the second active region OD_2. Only part of the second bit-line conductor BM1_BLB overlaps with the second active region OD_2. A backside contact V_BL_2 extends to the outside of the second active region OD_2 and does not fully cover by the second bit-line conductor BM1_BLB.

Figure 7:
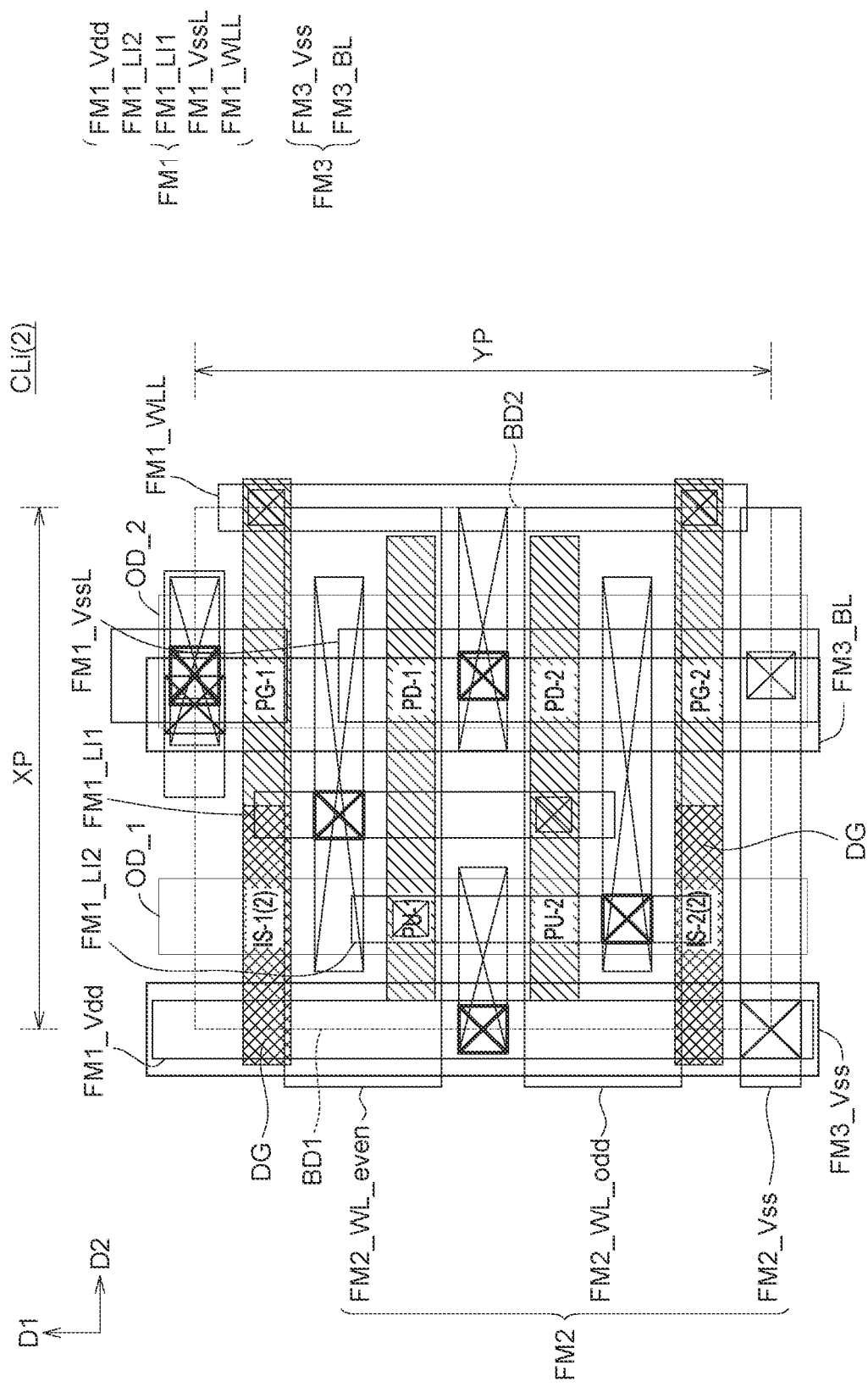
FIG. 7 shows a front-side diagrammatic plan view of an exemplified SRAM cell according to another embodiment.
Figure 8:
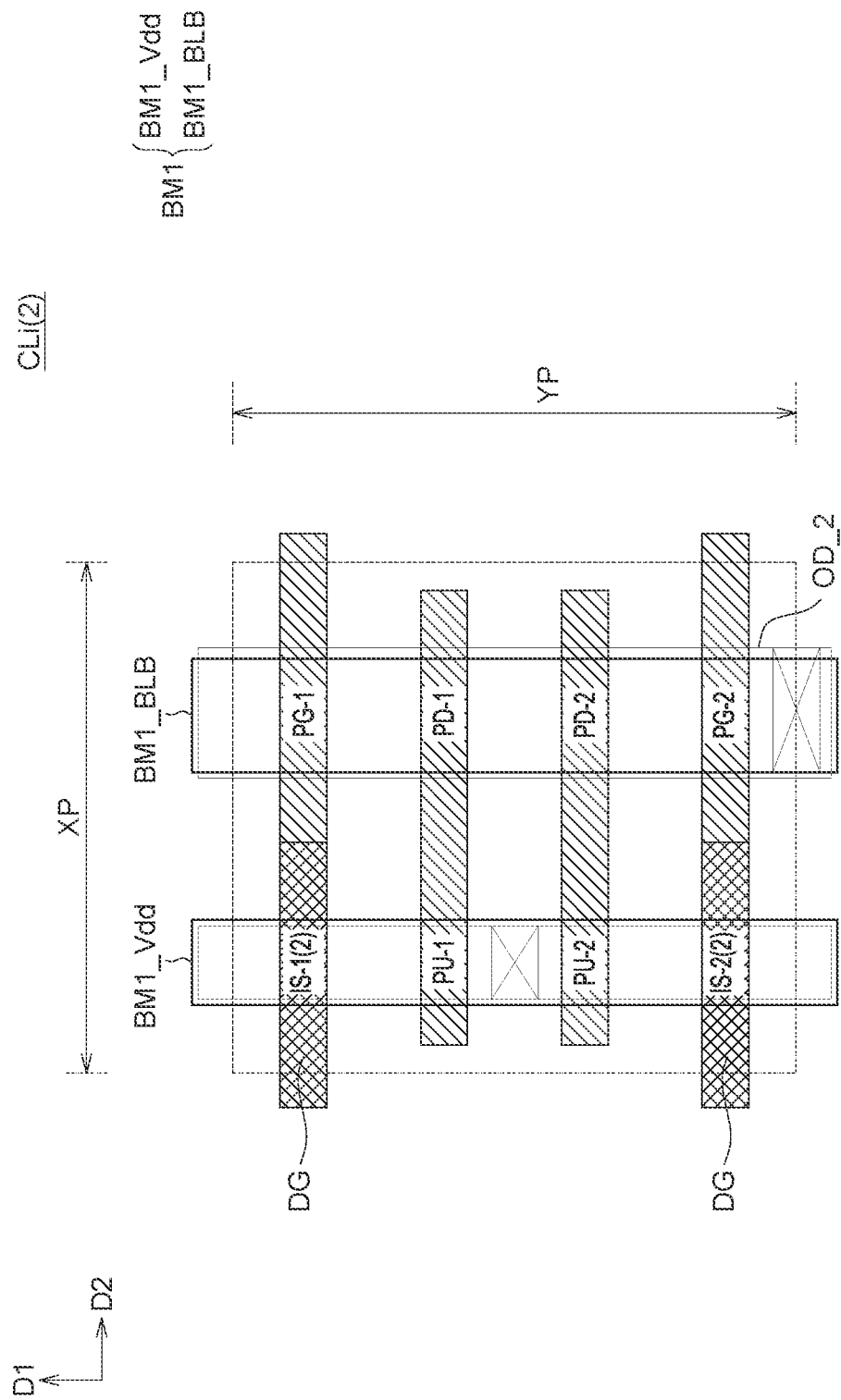
FIG. 8 shows a back-side diagrammatic plan view of the SRAM cell according to another embodiment.

Please refer to FIGS. 7 and 8. FIG. 7 shows a front-side diagrammatic plan view of an exemplified SRAM cell CLi(2) according to another embodiment. FIG. 8 shows a back-side diagrammatic plan view of the SRAM cell CLi(2) according to another embodiment. The SRAM cell CLi(2) includes the first active region OD_1, the second active region OD_2, the first pull-up transistor PU-1, the second pull-up transistor PU-2, a first isolation device IS-1(2), a second isolation device IS-2(2), the first pass-gate transistor PG-1, the second pass-gate transistor PG-2, the first pull-down transistor PD-1 and the second pull-down transistor PD-2.

The first active region OD_1 follows the first routing direction D1. The second active region OD_2 follows the first routing direction D1. The first pull-up transistor PU-1 is formed upon the first active region OD_1. The second pull-up transistor PU-2 is formed upon the first active region OD_1. The first isolation device IS-1(2) is located adjacent to the first pull-up transistor PU-1 and breaks the first active region OD_1. The second isolation device IS-2(2) is located adjacent to the second pull-up transistor PU-2 and breaks the first active region OD_1.

The first pass-gate transistor PG-1 is formed upon the second active region OD_2. The second pass-gate transistor PG-2 is formed upon the second active region OD_2. The first pull-down transistor PD-1 is formed upon the second active region OD_2. The second pull-down transistor PD-2 is formed upon the second active region OD_2.

The SRAM cell CLi(2) has the Y-pitch YP along the first routing direction D1. The Y-pitch YP is 4X contacted poly pitch (CPP).

The first isolation device IS-1(2) has a dummy dielectric gate structure DG used for isolating the first pull-up transistor PU-1 to another adjacent SRAM cell CLi(2), and the second isolation device IS-2(2) has a dummy dielectric gate structure DG used for isolating the second pull-up transistor PU-2 to another adjacent SRAM cell CLi(2).

The SRAM cell CLi(2) includes the first level front-side metal layer FM1, the second level front-side metal layer FM2 and the third level front-side metal layer FM3. The first level front-side metal layer FM1 includes the power supply voltage conductor FM1_Vdd, the common voltage landing pad FM1_VssL, the word-line landing line FM1_WLL, the first local connection line FM1_LI1 and the second local connection line FM1_LI2. The power supply voltage conductor FM1_Vdd is located at the first boundary BD1 of the SRAM cell CLi(2) and shared with another adjacent SRAM cell CLi(2), and electrically connected to the source node of the first pull-up transistor PU-1 and the source node of the second pull-up transistor PU-2. The common voltage landing pad FM1_VssL is electrically connected to the source node of the first pull-down transistor PU-1 and the source node of the second pull-down transistor PU-2. The word-line landing line FM1_WLL is located at the second boundary BD2 of the SRAM cell CLi(2) and shared with another adjacent SRAM cell CLi(2), and electrically connected to the gate node of the first pass-gate transistor PG-1 and the gate node of the second pass-gate transistor PG-2. The first local connection line FM1_LI1 is used to make an electrical connection among the drain node of the first pull-up transistor PU-1, the drain node of the first pull-down transistor PD-1, the drain node of the first pass-gate transistor PG-1, the gate node of the second pull-up transistor PU-2 and the gate node of the second pull-down transistor PD-2. The second local connection line FM1_LI2 is used to make an electrical connection among the drain node of the second pull-up transistor PU-2, the drain node of the second pull-down transistor PD-2, the drain node of the second pass-gate transistor PG-2, the gate node of the first pull-up transistor PU-1 and the gate node of the first pull-down transistor PD-1.

The second level front-side metal layer FM2 is located upon the first level front-side metal layer FM1. The second level front-side metal layer FM2 includes the first word-line conductor FM2_WL_odd, the second word-line conductor FM2_WL_even and the common voltage conductor FM2_Vss. The first word-line conductor FM2_WL_odd follows the second routing direction D2 substantially perpendicular to the first routing direction D1. The second word-line conductor FM2_WL_even follows the second routing direction D2. The common voltage conductor FM2_Vss follows the second routing direction D2. The common voltage conductor FM2_Vss is electrically connected to the common voltage landing pad FM1_VssL.

The third level front-side metal layer FM3 is located upon the second level front-side metal layer FM2. The third level front-side metal layer FM3 includes the first bit-line conductor FM3_BL and the common voltage conductor FM3_Vss. The first bit-line conductor FM3_BL is electrically connected to the source node of the first pass-gate transistor PG-1. The common voltage conductor FM3_Vss is electrically connected to the common voltage conductor FM3_Vss. The first bit-line conductor FM3_BL and the common voltage conductor FM3_Vss follow the first routing direction D1.

As shown in FIG. 7, the SRAM cell CLi(2) is rectangular shaped and a ratio of the X-pitch XP to the Y-pitch YP is within a range of 0.7 to 1.5.

Please refer to FIG. 8, which shows a back-side diagrammatic plan view of the SRAM cell CLi(2) according to one embodiment. The SRAM cell CLi(2) further includes the back-side metal layer BM1. The back-side metal layer BM1 includes the power supply voltage conductor BM1_Vdd and a second bit-line conductor BM1_BLB. The power supply voltage conductor BM1_Vdd is electrically connected to the source node of the first pull-up transistor PU-1 and the source node of the second pull-up transistor PU-2. The second bit-line conductor BM1_BLB is electrically connected to the source node of the second pass-gate transistor PG-2.

The power supply voltage conductor BM1_Vdd and the second bit-line conductor BM1_BLB follow the first routing direction D1.

As shown in FIGS. 7 and 8, the first bit-line conductor FM3_BL is located at the front-side of the SRAM cell CLi(2) and the second bit-line conductor BM1_BLB is located at the back-side of the SRAM cell CLi(2). Therefore, the routing loading as well as the cell size could be reduced. The less metal tracks in the same area (layer) also benefit the metal conductor RC performance. The SRAM cell CLi(2) could have lower resistance with wider width and/or lower capacitance with larger space.

In one SRAM cell CLi(2), 6 transistors, such as the first pull-up transistor PU-1, the second pull-up transistor PU-2, the first pass-gate transistor PG-1, the second pass-gate transistor PG-2, the first pull-down transistor PD-1 and the second pull-down transistor PD-2 are formed upon two discontinuous active regions, such as the first active region OD_1 and the second active region OD_2.

Figure 9:
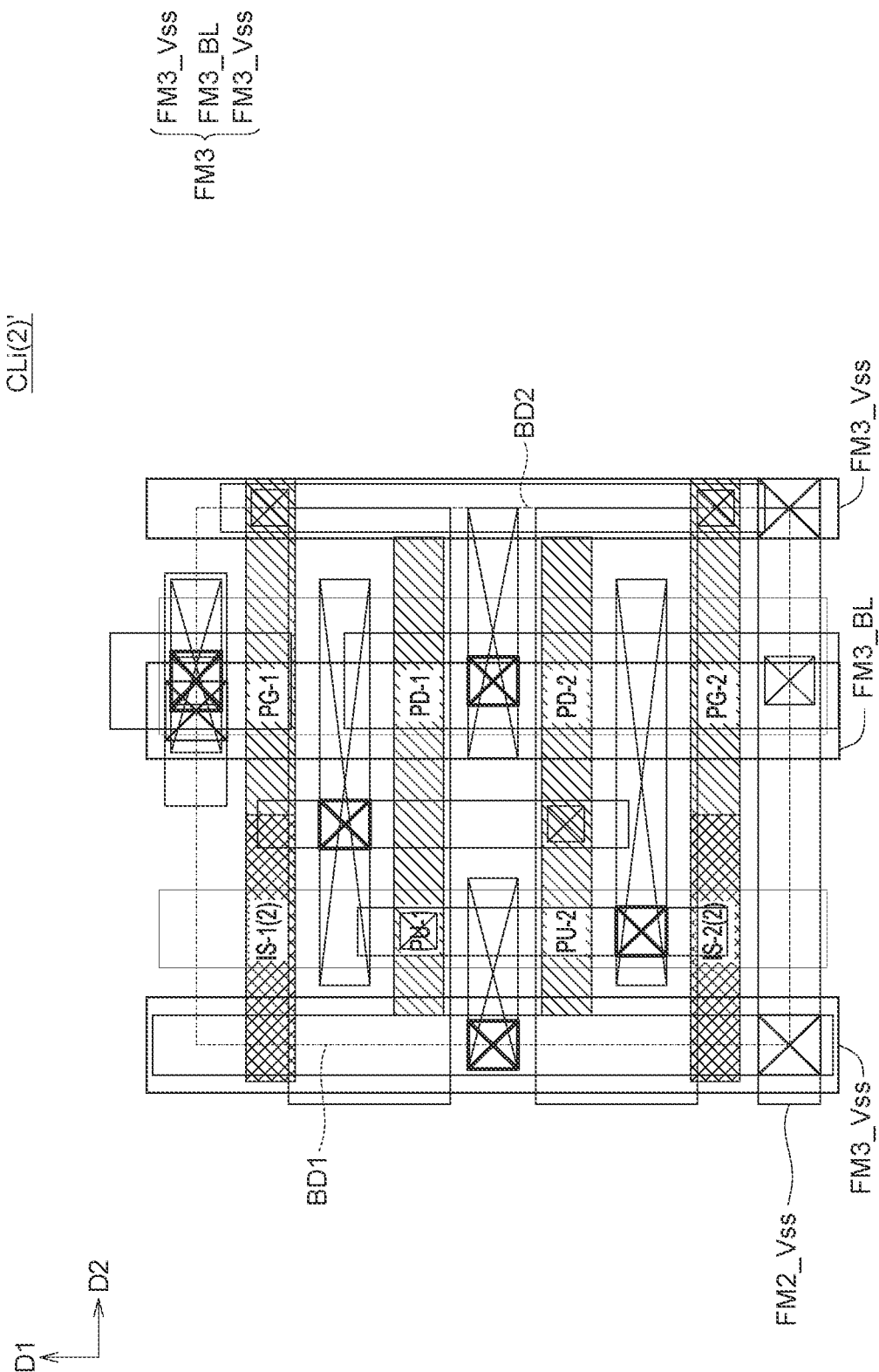
FIG. 9 shows a front-side diagrammatic plan view of an exemplified SRAM cell according to another embodiment.
Figure 10:
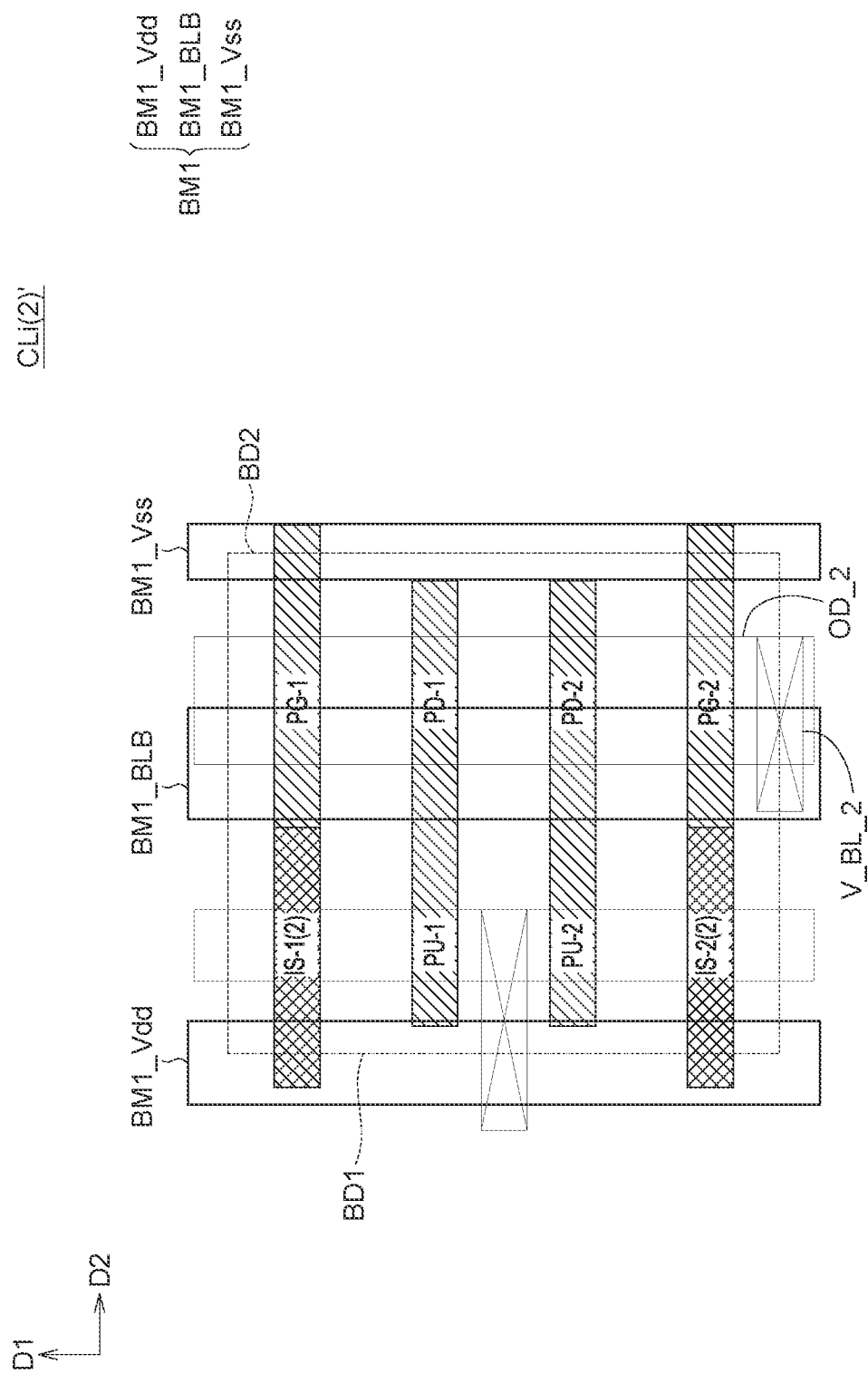
FIG. 10 shows a back-side diagrammatic plan view of the SRAM cell according to another embodiment.

Please refer to FIGS. 9 and 10. FIG. 9 shows a front-side diagrammatic plan view of an exemplified SRAM cell CLi(2)' according to another embodiment. FIG. 10 shows a back-side diagrammatic plan view of the SRAM cell CLi(2)' according to another embodiment. The SRAM cell CLi(2)' is similar to the SRAM cell CLi(2). In the SRAM cell CLi(2)', the third level front-side metal layer FM3 includes two common voltage conductors FM3_Vss. The two common voltage conductors FM3_Vss are located at the first boundary BD1 and the second boundary BD2 respectively and electrically connected to the common voltage conductors FM2_Vss. The back-side metal layer BM1 further includes a common voltage conductor BM1_Vss. The common voltage conductors BM1_Vss is located at the second boundary BD2.

In the SRAM cell CLi(2)' of FIG. 10, the second bit-line conductor BM1_BLB is shifted from the second active region OD_2. Only part of the second bit-line conductor BM1_BLB overlapped with the second active region OD_2. The backside contact V_BL_2 extends to the outside of the second active region OD_2 and does not fully cover by the second bit-line conductor BM1_BLB.

Figure 11:
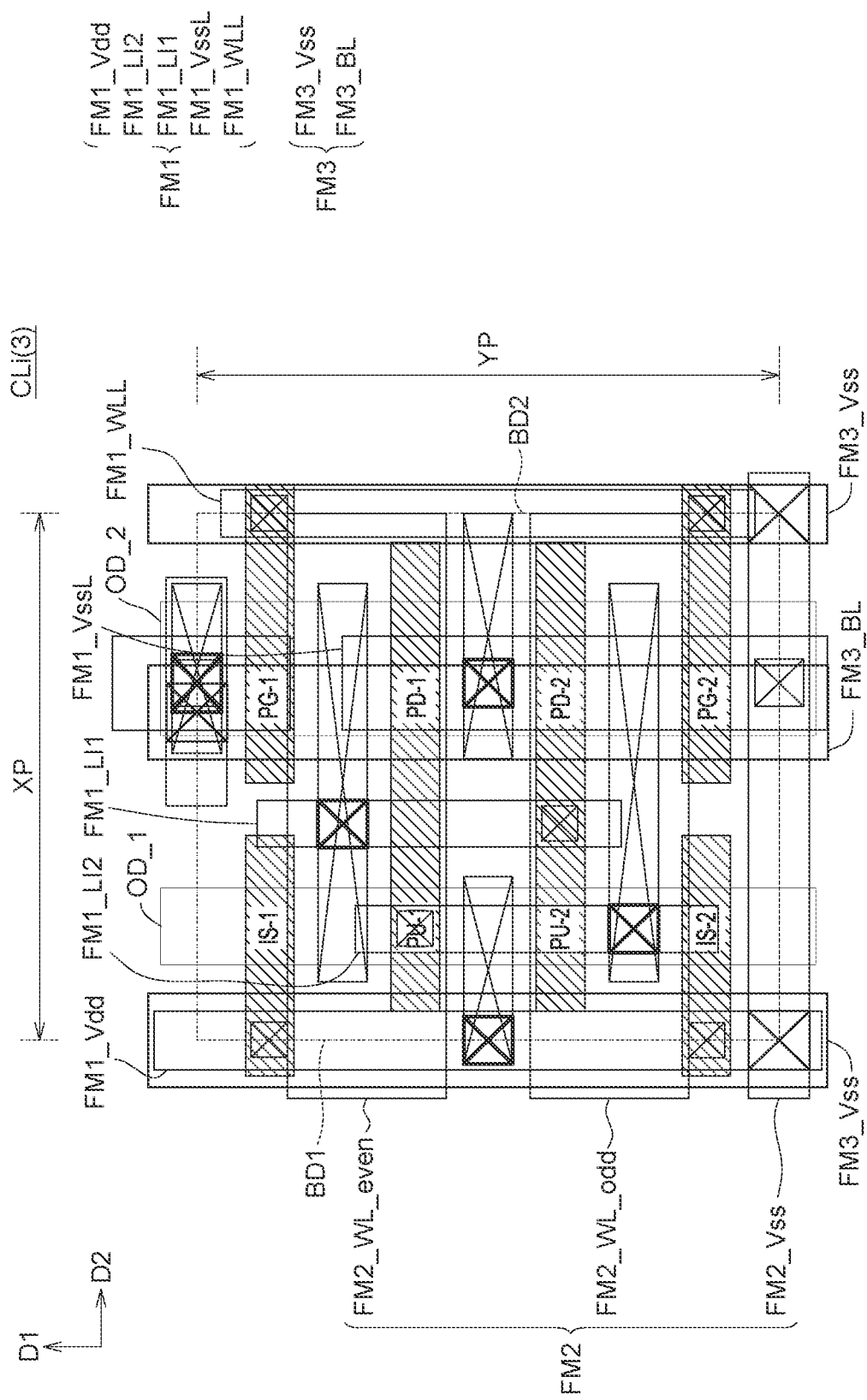
FIG. 11 shows a front-side diagrammatic plan view of an exemplified SRAM cell according to one embodiment.

Please refer to FIG. 11, which shows a front-side diagrammatic plan view of an exemplified SRAM cell CLi(3) according to one embodiment. The SRAM cell CLi(3) includes the first active region OD_1, the second active region OD_2, the first pull-up transistor PU-1, the second pull-up transistor PU-2, the first isolation transistor IS-1, the second isolation transistor IS-2, the first pass-gate transistor PG-1, the second pass-gate transistor PG-2, the first pull-down transistor PD-1 and the second pull-down transistor PD-2.

The first active region OD_1 follows a first routing direction D1. The second active region OD_2 follows the first routing direction D1. The first pull-up transistor PU-1 is formed upon the first active region OD_1. The second pull-up transistor PU-2 is formed upon the first active region OD_1. The first isolation transistor IS-1 is formed upon the first active region OD_1. The second isolation transistor IS-2 is formed upon the first active region OD_1.

The first pass-gate transistor PG-1 is formed upon the second active region OD_2. The second pass-gate transistor PG-2 is formed upon the second active region OD_2. The first pull-down transistor PD-1 is formed upon the second active region OD_2. The second pull-down transistor PD-2 is formed upon the second active region OD_2.

The SRAM cell CLi(1) has a Y-pitch YP along the first routing direction D1. The Y-pitch YP is 4X contacted poly pitch (CPP).

The SRAM cell CLi(3) includes the first level front-side metal layer FM1, the second level front-side metal layer FM2 and the third level front-side metal layer FM3. The first level front-side metal layer FM1 includes the power supply voltage conductor FM1_Vdd, the common voltage landing pad FM1_VssL, the word-line landing line FM1_WLL, the first local connection line FM1_LI1 and the second local connection line FM1_LI2. The power supply voltage conductor FM1_Vdd is located at the first boundary BD1 of the SRAM cell CLi(3) and shared with another adjacent SRAM cell CLi(3), and electrically connected to the source node of the first pull-up transistor PU-1 and the source node of the second pull-up transistor PU-2. The common voltage landing pad FM1_VssL is electrically connected to the source node of the first pull-down transistor PU-1 and the source node of the second pull-down transistor PU-2. The word-line landing line FM1_WLL is located at the second boundary BD2 and shared with another adjacent SRAM cell CLi(3), and electrically connected to the gate node of the first pass-gate transistor PG-1 and the gate node of the second pass-gate transistor PG-2. The first local connection line FM1_LI1 is used to make an electrical connection among the drain node of the first pull-up transistor PU-1, the drain node of the first pull-down transistor PD-1, the drain node of the first pass-gate transistor PG-1, the gate node of the second pull-up transistor PU-2 and the gate node of the second pull-down transistor PD-2. The second local connection line FM1_LI2 is used to make an electrical connection among a drain node of the second pull-up transistor PU-2, a drain node of the second pull-down transistor PD-2, a drain node of the second pass-gate transistor PG-2, the gate node of the first pull-up transistor PU-1 and the gate node of the first pull-down transistor PD-1.

The second level front-side metal layer FM2 is located upon the first level front-side metal layer FM1. The second level front-side metal layer FM2 includes the first word-line conductor FM2_WL_odd, the second word-line conductor FM2_WL_even and the common voltage conductor FM2_Vss. The first word-line conductor FM2_WL_odd follows the second routing direction D2 substantially perpendicular to the first routing direction D1. The second word-line conductor FM2_WL_even follows the second routing direction D2. The common voltage conductor FM2_Vss follows the second routing direction D2. The common voltage conductor FM2_Vss is electrically connected to the common voltage landing pad FM1_VssL.

The third level front-side metal layer FM3 is located upon the second level front-side metal layer FM2. The third level front-side metal layer FM3 includes the first bit-line conductor FM3_BL and the two common voltage conductors FM3_Vss. The first bit-line conductor FM3_BL is electrically connected to the source node of the first pass-gate transistor PG-1. The two common voltage conductors FM3_Vss are located at the first boundary BD1 and the second boundary BD2 respectively and electrically connected to the common voltage conductors FM2_Vss. The first bit-line conductor FM3_BL and the common voltage conductors FM3_Vss follow the first routing direction D1.

As shown in FIG. 11, the SRAM cell CLi(3) is rectangular shaped and a ratio of the X-pitch XP to the Y-pitch YP is within a range of 0.7 to 1.5.

Figure 12:
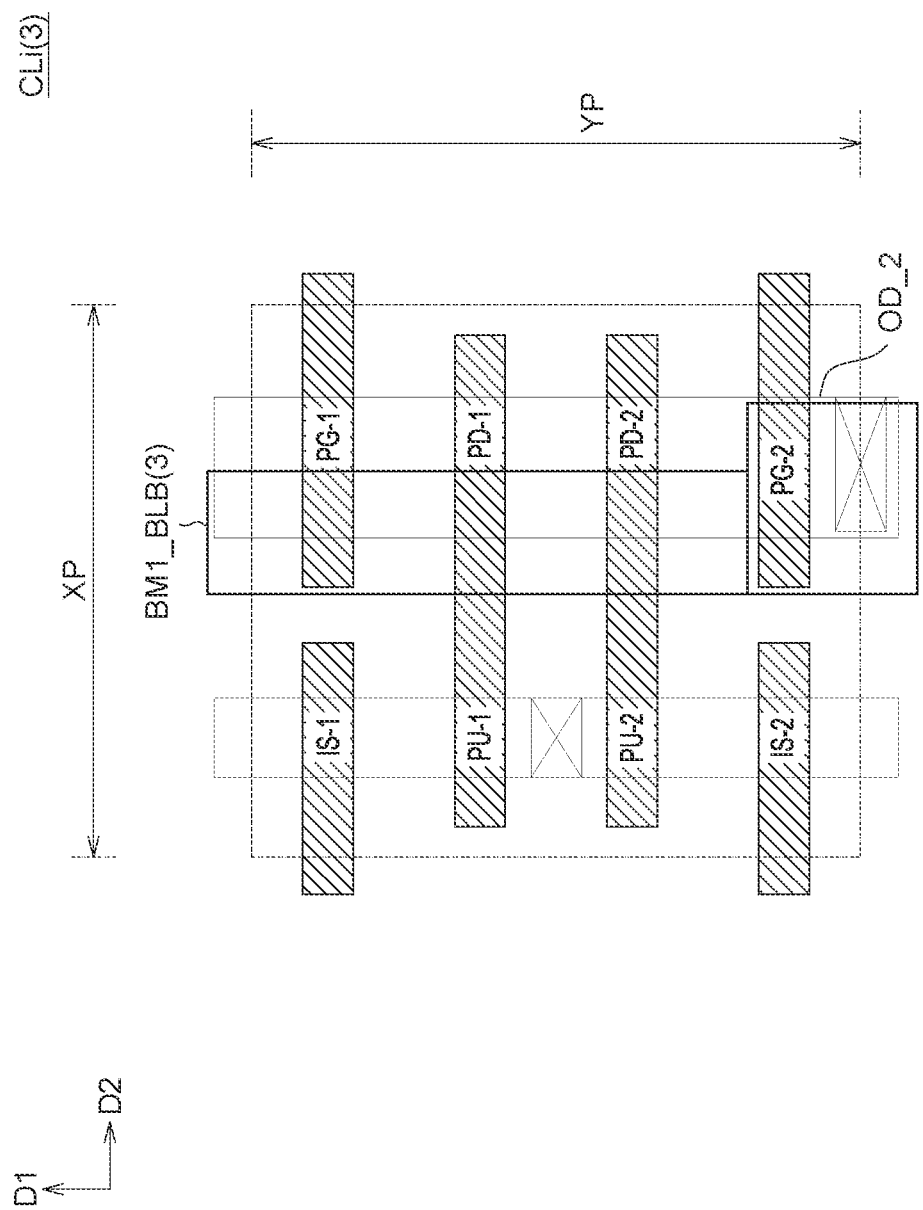
FIG. 12 shows a back-side diagrammatic plan view of the SRAM cell according to one embodiment.

Please refer to FIG. 12, which shows a back-side diagrammatic plan view of the SRAM cell CLi(3) according to one embodiment. The SRAM cell CLi(3) further includes the back-side metal layer BM1. The back-side metal layer BM1 includes a second bit-line conductor BM1_BLB(3) without any power supply voltage conductor or any common voltage conductor. The second bit-line conductor BM1_BLB(3) is electrically connected to the source node of the second pass-gate transistor PG-2. The second bit-line conductor BM1_BLB(3) follows the first routing direction D1 with a jog layout. The jog layout could reduce the capacitance.

As shown in FIGS. 11 and 12, the first bit-line conductor FM3_BL is located at the front-side of the SRAM cell CLi(3) and the second bit-line conductor BM1_BLB(3) is located at the back-side of the SRAM cell CLi(3). Therefore, the routing loading as well as the cell size could be reduced. The less metal tracks in the same area (layer) also benefit the metal conductor RC performance. The SRAM cell CLi(3) could have lower resistance with wider width and/or lower capacitance with larger space.

In the SRAM cell CLi(3), 8 transistors, such as the first pull-up transistor PU-1, the second pull-up transistor PU-2, the first isolation transistor IS-1, the second isolation transistor IS-2, the first pass-gate transistor PG-1, the second pass-gate transistor PG-2, the first pull-down transistor PD-1 and the second pull-down transistor PD-2 are formed upon two continuous active regions, such as the first active region OD_1 and the second active region OD_2.

Figure 13:
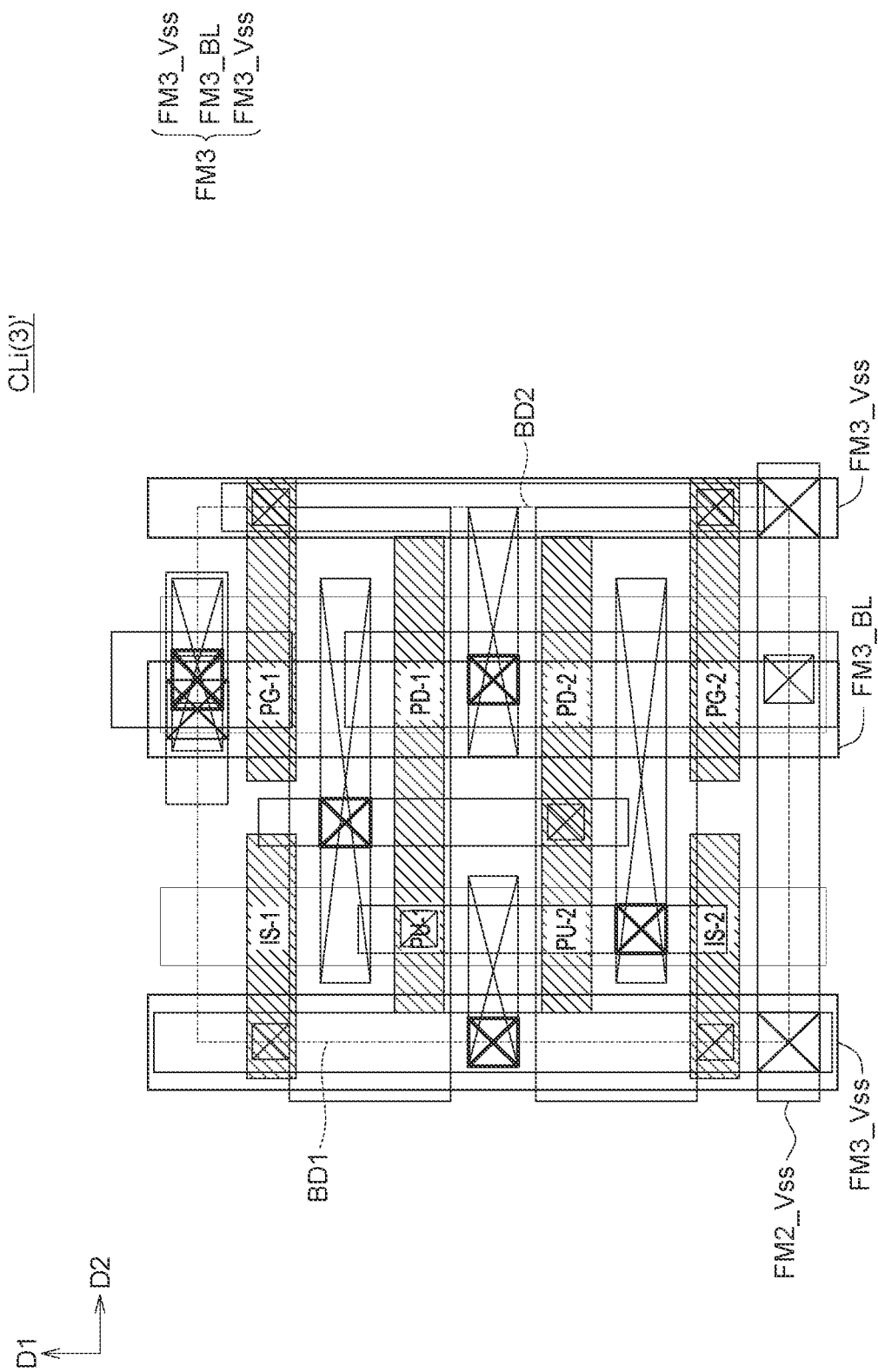
FIG. 13 shows a front-side diagrammatic plan view of an exemplified SRAM cell according to another embodiment.
Figure 14:
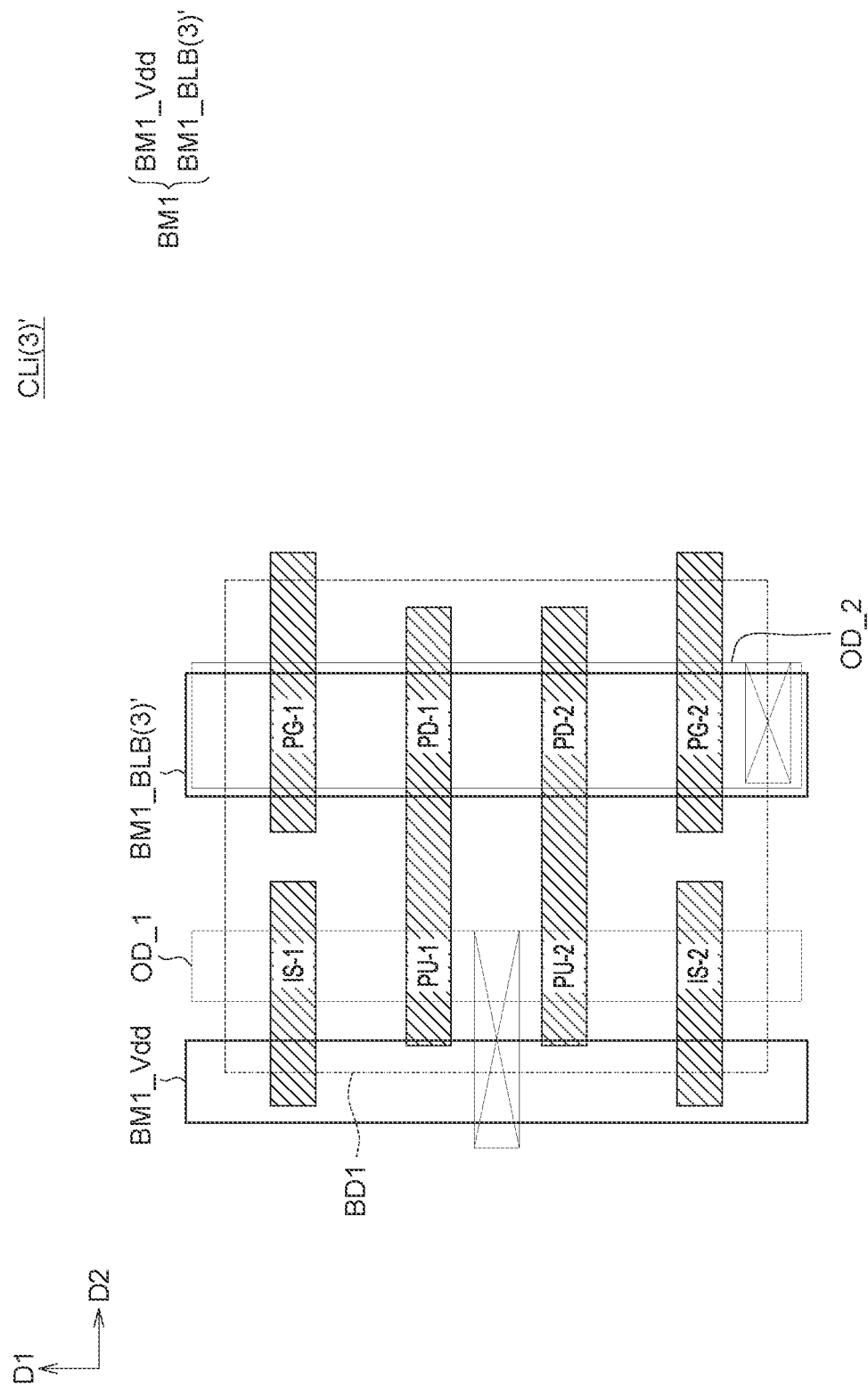
FIG. 14 shows a back-side diagrammatic plan view of the SRAM cell according to another embodiment.

Please refer to FIGS. 13 and 14. FIG. 13 shows a front-side diagrammatic plan view of an exemplified SRAM cell CLi(3)' according to another embodiment. FIG. 14 shows a back-side diagrammatic plan view of the SRAM cell CLi(3)' according to another embodiment. The SRAM cell CLi(3)' is similar to the SRAM cell CLi(3). In the SRAM cell CLi(3)', the third level front-side metal layer FM3 includes two common voltage conductors FM3_Vss. The two common voltage conductors FM3_Vss are located at the first boundary BD1 and the second boundary BD2 respectively and electrically connected to the common voltage conductors FM2_Vss. The back-side metal layer BM1 includes the power supply voltage conductors BM1_Vdd and the second bit-line conductor BM1_BLB(3)' without any common voltage conductor. The power supply voltage conductors BM1_Vdd is located at the first boundary BD1 and located at the outside of the first active region OD_1.

In the SRAM cell CLi(3)' of FIG. 14, the power supply voltage conductors BM1_Vdd is shifted from the first active region OD_1. None of the power supply voltage conductors BM1_Vdd overlaps with the first active region OD_1.

Figure 15:
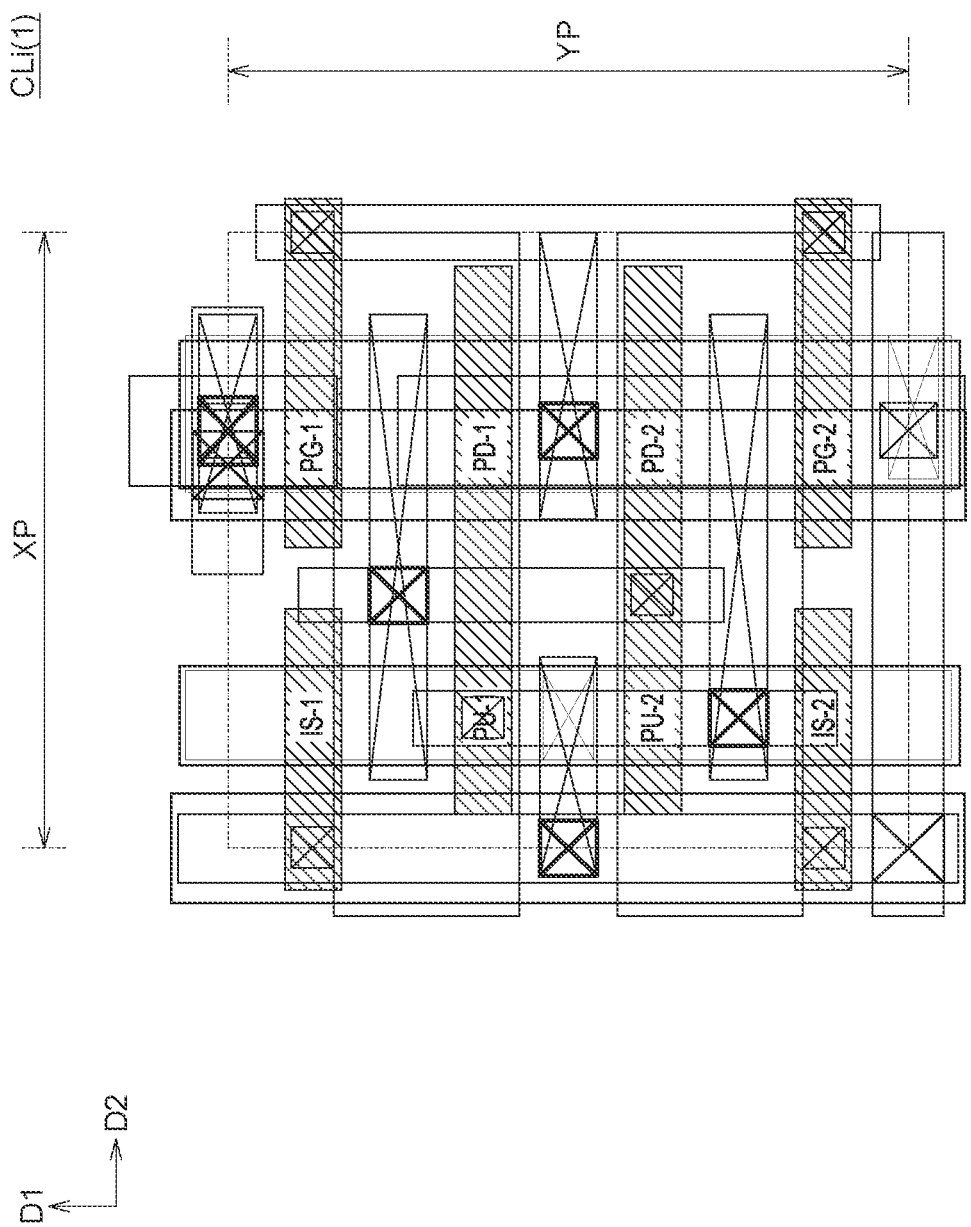
FIG. 15 shows an overlaid diagram of FIG. 3 and FIG. 4.
Figure 16:
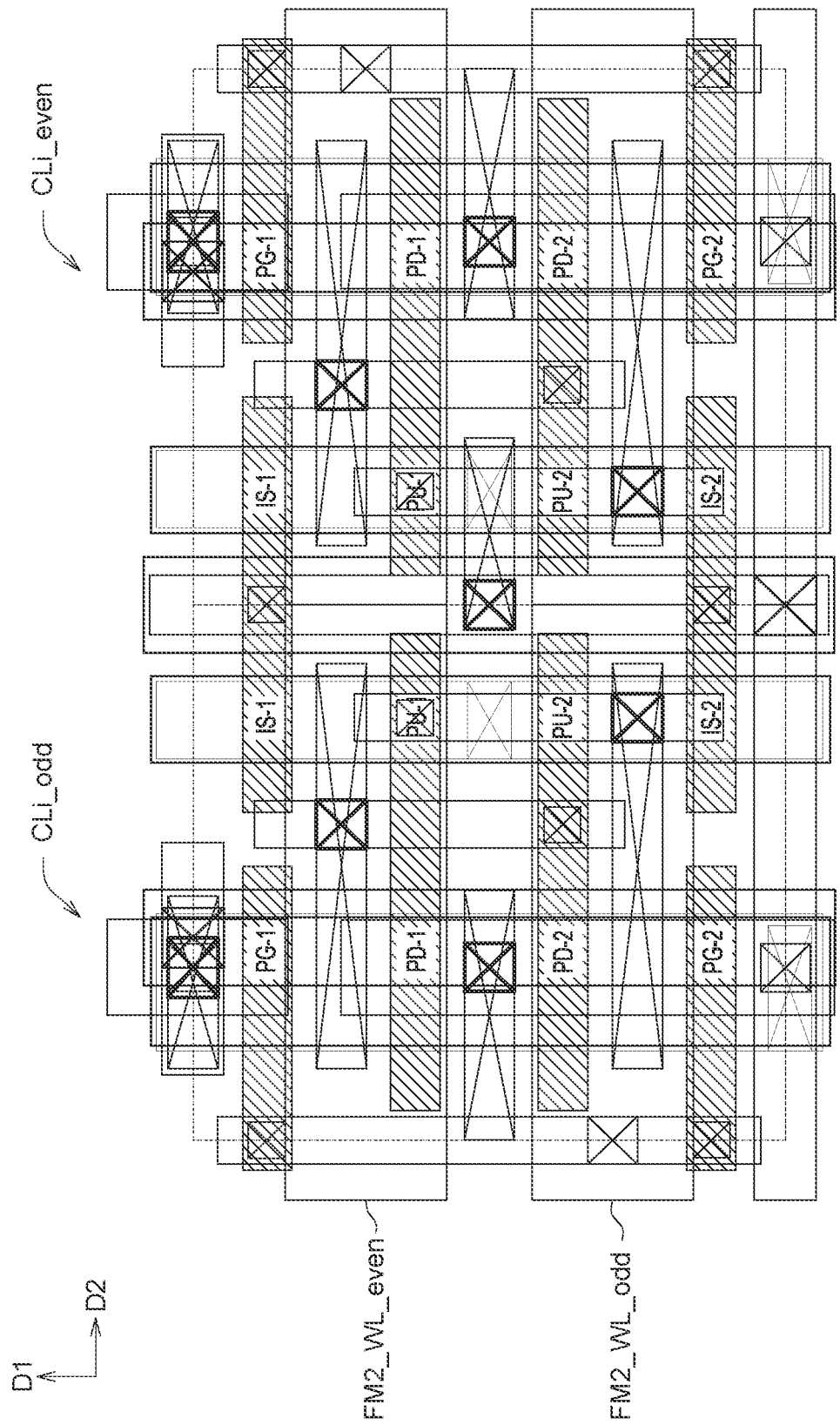
FIG. 16 shows two adjacent SRAM cells according to one embodiment.

Please refer to FIG. 15, which shows an overlaid diagram of FIG. 3 and FIG. 4. Please refer to FIG. 16, which shows two adjacent SRAM cells CLi_odd, CLi_even according to one embodiment. The SRAM cell CLi_even is exemplified as the SRAM cell CLi(1) of FIG. 15. The two adjacent SRAM cells CLi_odd, CLi_even are arranged in the second routing direction D2 substantially perpendicular to the first routing direction D1. The SRAM cell CLi_odd and the SRAM cell CLi_even are mirror symmetric. Each of the SRAM cells CLi_odd, CLi_even includes the first word-line conductor FM2_WL_odd and the second word-line conductor FM2_WL_even. The first word-line conductor FM2_WL_odd is electrically connected to a gate node of the first pass-gate transistor PG-1 and a gate node of the second pass-gate transistor PG-2 of the SRAM cell CLi_odd, the second word-line conductor FM2_WL_even is electrically connected to a gate node of the first pass-gate transistor PG-1 and a gate node of the second pass-gate transistor PG-2 of the SRAM cell CLi_even.

Figure 17:
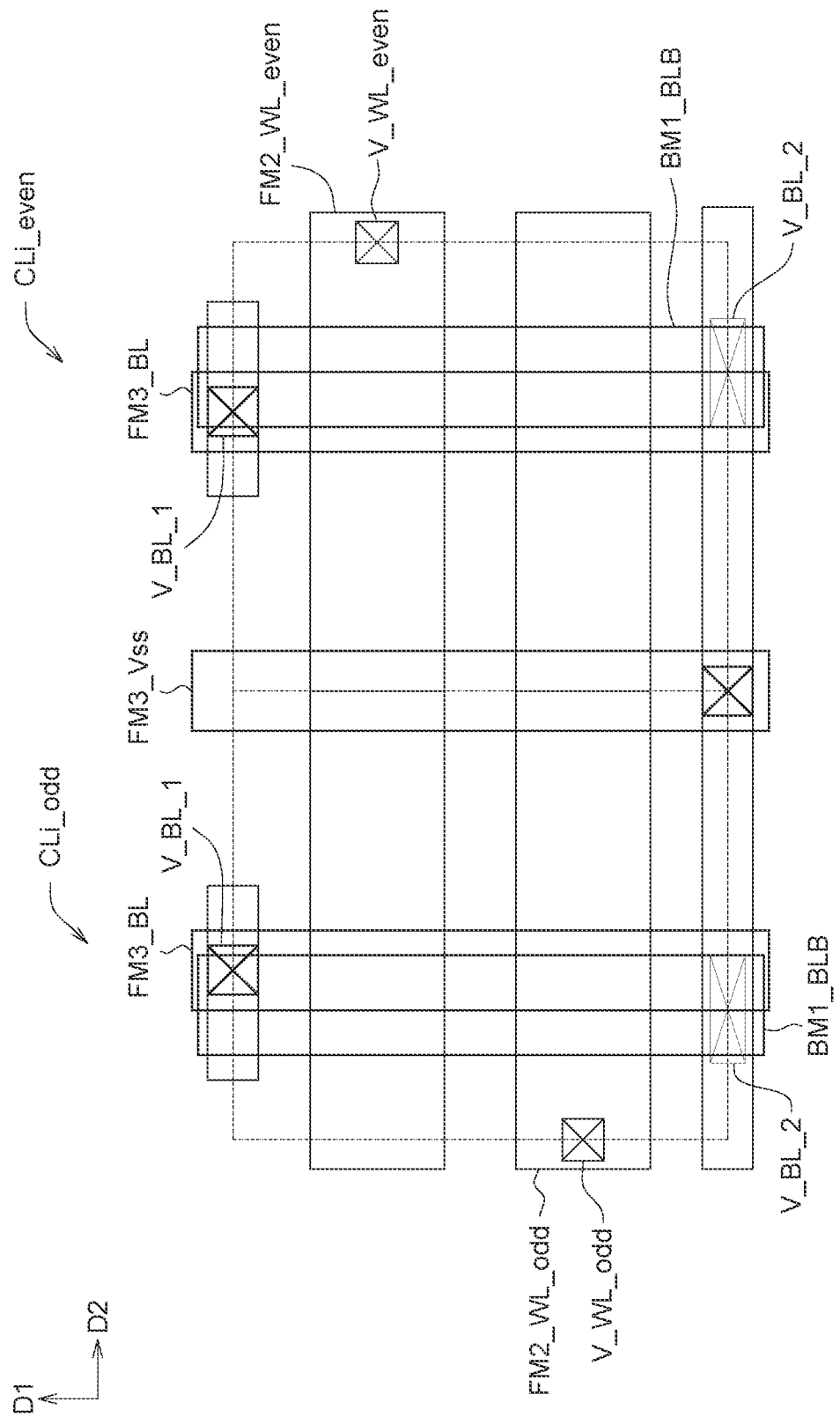
FIG. 17 shows a first word-line conductor, a second word-line conductor, a first bit-line conductor and a second bit-line conductor of the SRAM cell.

Please refer to FIG. 17, which shows the first word-line conductor FM2_WL_odd, the second word-line conductor FM2_WL_even, the first bit-line conductor FM3_BL and the second bit-line conductor BM1_BLB of the SRAM cell CLi_odd and the SRAM cell CLi_even. The first word-line conductor FM2_WL_odd and the second word-line conductor FM2_WL_even follow the first routing direction D1. The first bit-line conductor FM3_BL and the second bit-line conductor BM1_BLB follow the second routing direction D2. In the SRAM cell CLi_even, the via V_BL_1 is used to connect to the first bit-line conductor FM3_BL, the backside contact V_BL_2 is used to connect to the second bit-line conductor BM1_BLB, the via V_WL_even is used to connect to the second word-line conductor FM2_WL_even. In the SRAM cell CLi_odd, the via V_BL_1 is used to connect to the first bit-line conductor FM3_BL, the backside contact V_BL_2 is used to connect to the second bit-line conductor BM1_BLB, the via V_WL_odd is used to connect to the first word-line conductor FM2_WL_odd.

As shown in FIG. 17, for the two adjacent SRAM cells CLi_odd, SRAM cell CLi_even, only two word lines (the first word-line conductor FM2_WL_odd and the second word-line conductor FM2_WL_even) are arranged and four bit lines (the first bit-line conductors FM3_BL and the second bit-line conductors BM1_BLB) are arranged.

Figure 18:
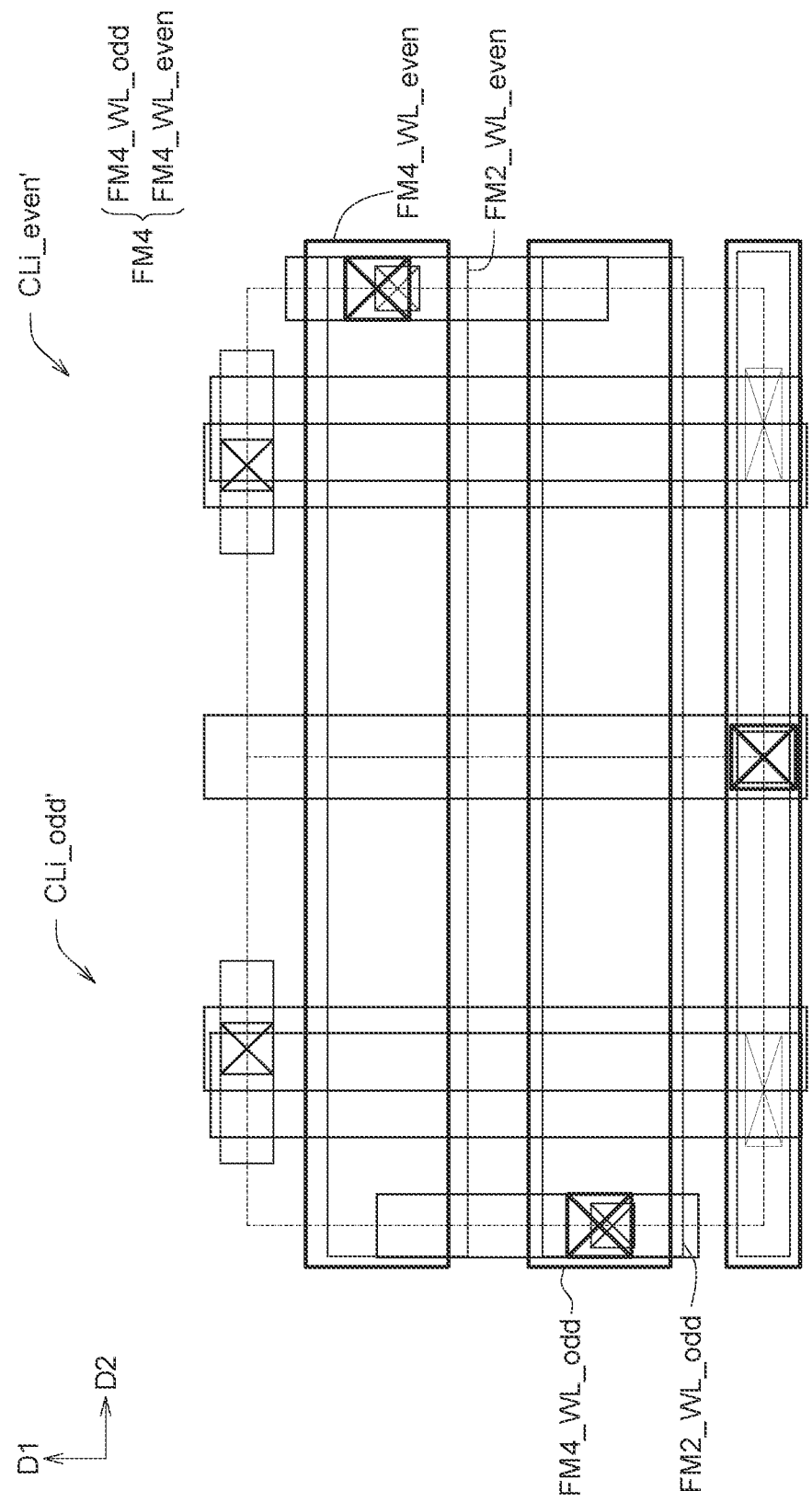
FIG. 18 shows the first word-line conductor, the second word-line conductor, a third word-line conductor and a fourth word-line conductor of a SRAM cell.

Please refer to FIG. 18, which shows the first word-line conductor FM2_WL_odd, the second word-line conductor FM2_WL_even, a third word-line conductor FM4_WL_odd and a fourth word-line conductor FM4_WL_even of a SRAM cell CLi_odd' and a SRAM cell CLi_even'. Each of the SRAM cells CLi_odd', CLi_even' includes a fourth level front-side metal layer FM4. The fourth level front-side metal layer FM4 includes a third word-line conductor FM4_WL_odd and a fourth word-line conductor FM4_WL_even. The third word-line conductor FM4_WL_odd follows the second routing direction D2 substantially perpendicular to the first routing direction D1, and electrically connected to the first word-line conductor FM2_WL_odd. The fourth word-line conductor FM4_WL_even follows the second routing direction D2, and electrically connected to the second word-line conductor FM2_WL_even. The first word-line conductor FM2_WL_odd and the third word-line conductor FM4_WL_odd are connected together, and the second word-line conductor FM2_WL_even and the fourth word-line conductor FM4_WL_even are connected together, so that the resistance could be greatly reduced.

Figure 19:
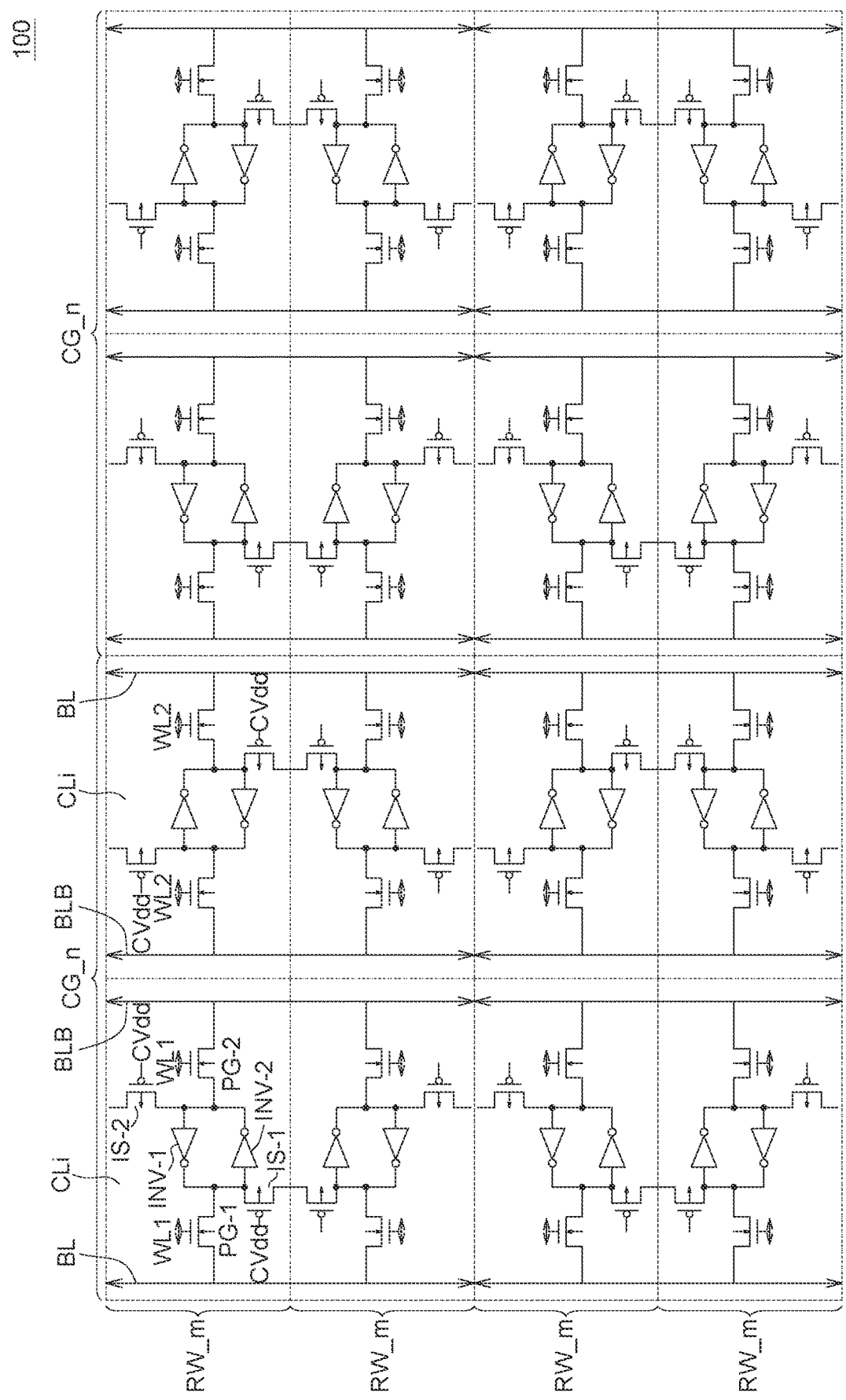
FIG. 19 shows a circuit diagram of the integrated circuit structure according to one embodiment.

Please refer to FIG. 19, which shows a circuit diagram of the integrated circuit structure 100 according to one embodiment. The SRAM cells CLi in the integrated circuit structure 100 of FIG. 19 could be the SRAM cell CLi(1) of FIGS. 3 and 4, the SRAM cell CLi(1)' of FIGS. 5 and 6, the SRAM cell CLi(3) of FIGS. 11 and 12, or the SRAM cell CLi(3)' of FIGS. 13 and 14. Each of the SRAM cells CLi includes the first pass-gate transistor PG-1, the second pass-gate transistor PG-2, the first inverter INV-1, a second inverter INV-2, the first isolation transistor IS-1 and the second isolation transistor IS-2. Each of the first isolation transistor IS-1 and the second isolation transistor IS-2 includes a drain node, a source node and a gate node, and the gate node of each of the first isolation transistor IS-1 and the second isolation IS-2 is electrically connected to the power supply voltage CVdd.

Each row RW_m comprises two independent word lines, such as a first word WL1 and a second word line WL2. Two adjacent columns form a column group CG_n. The SRAM cells CLi in the first column are electrically connected to the first word lines WL1, and the SRAM cells CLi in the second column are electrically connected to the second word lines WL2.

Figure 20:
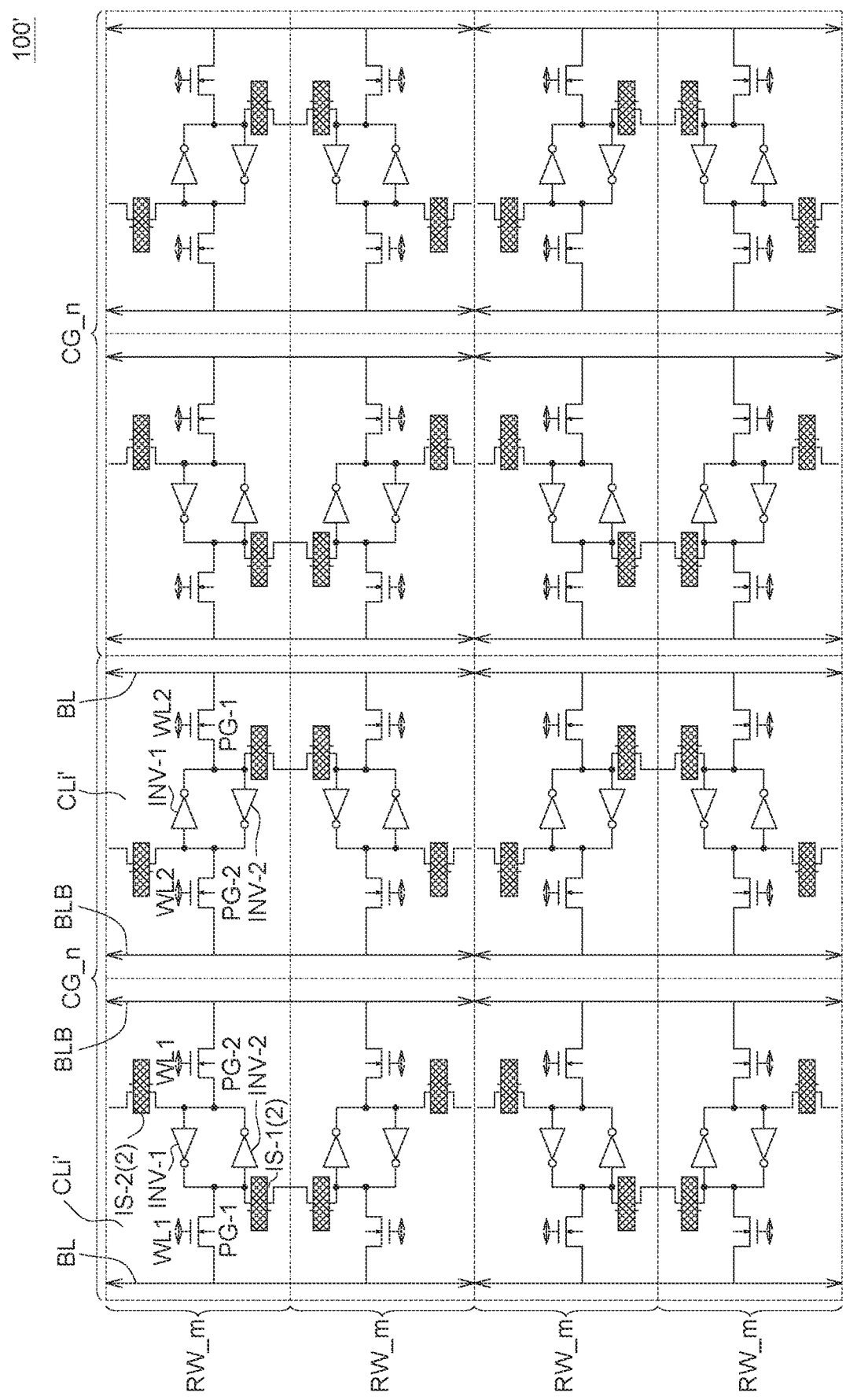
FIG. 20 shows a circuit diagram of an integrated circuit structure according to one embodiment.

Please refer to FIG. 20, which shows a circuit diagram of an integrated circuit structure 100' according to one embodiment. The SRAM cell CLi' in the integrated circuit structure 100' of FIG. 20 could be the SRAM cell CLi(2) of FIGS. 7 and 8 or the SRAM cell CLi(2)' of FIGS. 9 and 10. Each of the SRAM cells CLi' includes the first pass-gate transistor PG-1, the second pass-gate transistor PG-2, the first inverter INV-1, a second inverter INV-2, the first isolation device IS-1(2) and the second isolation device IS-2(2). Each of the first isolation device IS-1(2) and the second isolation device IS-2(2) has a dummy dielectric gate structure.

Each row RW_m comprises two independent word lines, such as the first word line WL1 and the second word line WL2. Two adjacent columns form a column group CG_n. The SRAM cells CLi' in the first column are electrically connected to the first word lines WL1, and the SRAM cells CLi' in the second column are electrically connected to the second word lines WL2.

Figure 21:
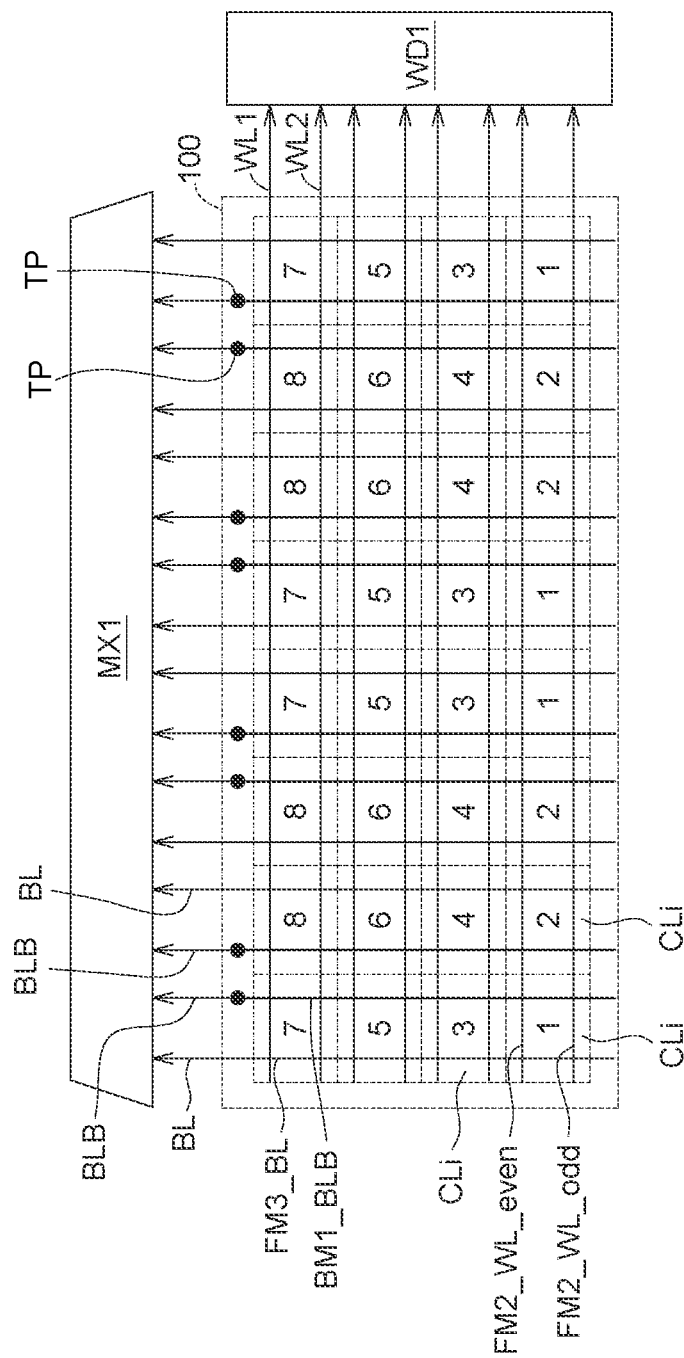
FIG. 21 shows an arrangement of the SRAM cells in the integrated circuit structure.

Please refer to FIG. 21, which shows an arrangement of the SRAM cells CLi (or CLi') in the integrated circuit structure 100 (or 100'). The SRAM cells CLi (or CLi') are arranged in an array. The plurality of first bit lines BL connected to the first bit-line conductor FM3_BL and the plurality of second bit lines BLB connected to the second bit-line conductor BM1_BLB of the SRAM cells CLi (or CLi') are connected to a column MUX MX1. The plurality of first word lines WL1 connected to the first word-line conductor FM2_WL_odd and the plurality of second word lines WL2 connected to the second word-line conductor FM2_WL_even of the SRAM cell CLi (or CLi') are connected to the word line decoder WD1.

As shown in FIG. 21, the integrated circuit structure 100 (or 100') further includes at least one tap structure TP. The tap structures TP are located at an edge of the array of the SRAM cells CLi (or CLi'). Each of the tap structures TP is used to make an electrical connection among the back-side of the SRAM cells CLi (or CLi') and the front-side of the SRAM cells CLi (or CLi'), such that the second bit-line conductors BM1_BLB located at the back-side of the SRAM cells CLi (or CLi') could be connected to the second bit lines BLB.

Figure 22:
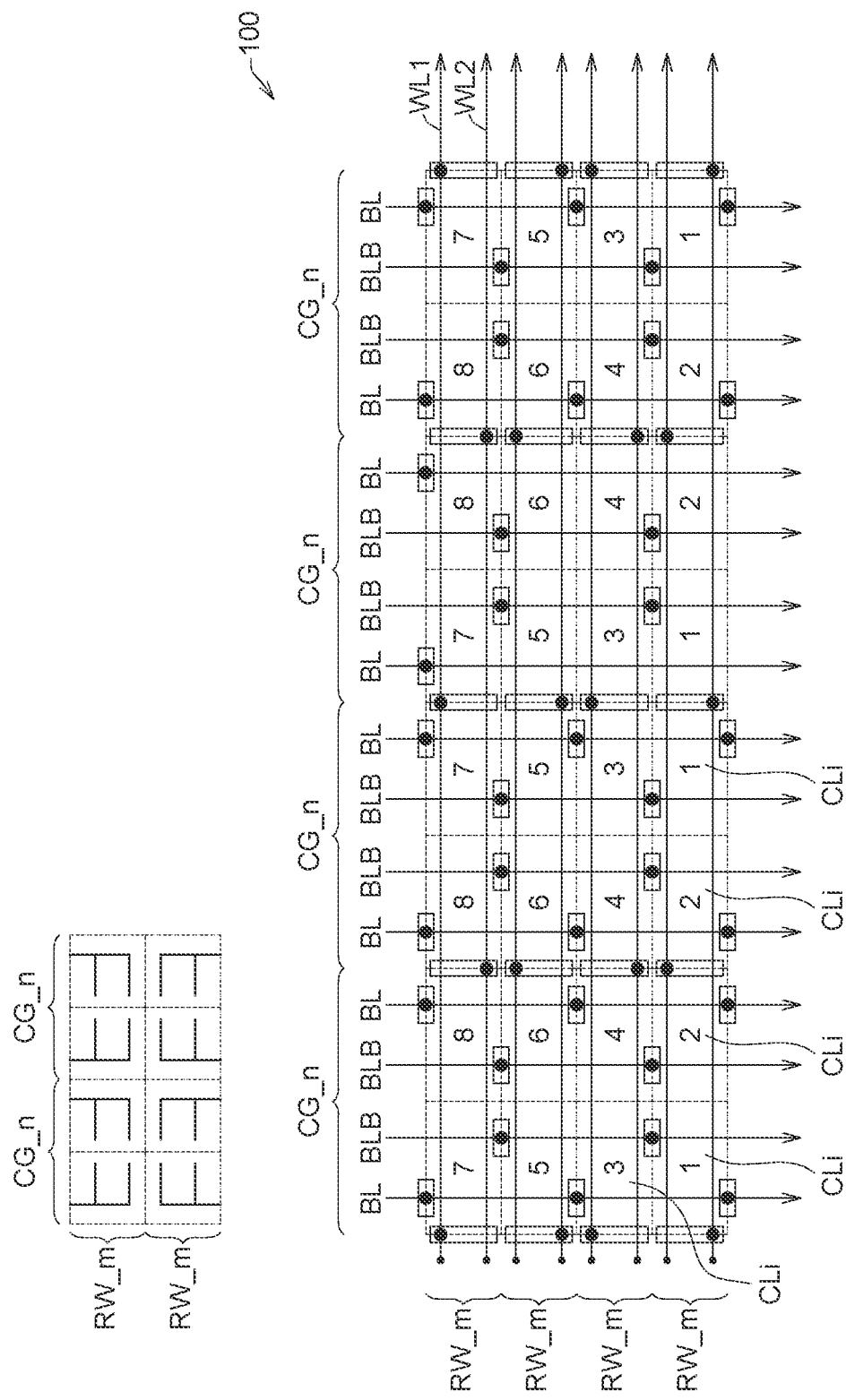
FIG. 22 illustrates the arrangement of the SRAM cells in the integrated circuit structure.

Please refer to FIG. 22, which illustrates the arrangement of the SRAM cells CLi (or CLi') in the integrated circuit structure 100 (or 100'). The SRAM cells CLi (or CLi') in every two adjacent columns are mirror symmetric. The SRAM cells CLi (or CLi') in every two adjacent column groups CG_n are mirror symmetric. The SRAM cells CLi (or CLi') in every two adjacent rows RW_m are mirror symmetric.

According to the embodiment described above, the part of the lower level metal, such as the second bit-line conductor BM1_BLB or the common voltage conductor BM1_Vss, is moved to the back-side of the wafer to reduce the routing loading as well as cell size further reduction. The less metal tracks in the same area (layer) also benefits the metal conductor RC performance. The SRAM cell CLi could have lower resistance with wider width and/or lower capacitance with larger space.

Moreover, two horizontal SRAM cells CLi (or CLi') in one row are grouped in the column group CG_n, such that the FEOL/MEOL capacitance could be improved about 50%.

Further, the two additional elements, such as the first isolation transistor IS-1 and the second isolation transistor IS-2 do not cause any extra cost or area penalty.

The SRAM cell CLi (or CLi') has fully symmetry or balance on the active region environment, such as the first active region OD_1 and the second active region OD_2, and therefore the device stability and the cell matching can be improved.

According to one embodiment, an integrated circuit structure is provided. The integrated circuit structure includes at least one static random-access memory (SRAM) cell. The SRAM cell includes a first active region, a second active region, a first pull-up transistor, a second pull-up transistor, a first isolation transistor, a second isolation transistor, a first pass-gate transistor, a second pass-gate transistor, a first pull-down transistor and a second pull-down transistor. The first active region follows a first routing direction. The second active region follows the first routing direction. The first pull-up transistor is formed upon the first active region. The second pull-up transistor is formed upon the first active region. The first isolation transistor is formed upon the first active region. The second isolation transistor is formed upon the first active region. The first pass-gate transistor is formed upon the second active region. The second pass-gate transistor is formed upon the second active region. The first pull-down transistor is formed upon the second active region. The second pull-down transistor is formed upon the second active region. Each of the at least one SRAM cell has a Y-pitch along the first routing direction. The Y-pitch is 4X contacted poly pitch (CPP).

According to another embodiment, an integrated circuit structure is provided. The integrated circuit structure includes at least one static random-access memory (SRAM) cell. The SRAM cell includes a first active region, a second active region, a first pull-up transistor, a second pull-up transistor, a first isolation device, a second isolation device, a first pass-gate transistor, a second pass-gate transistor, a first pull-down transistor and a second pull-down transistor. The first active region follows a first routing direction. The second active region follows the first routing direction. The first pull-up transistor is formed upon the first active region. The second pull-up transistor is formed upon the first active region. The first isolation device is located adjacent to the first pull-up transistor and breaks the first active region. The second isolation device is located adjacent to the second pull-up transistor and breaks the first active region. The first pass-gate transistor is formed upon the second active region. The second pass-gate transistor is formed upon the second active region. The first pull-down transistor is formed upon the second active region. The second pull-down transistor is formed upon the second active region. Each of the at least one SRAM cell has a Y-pitch along the first routing direction. The Y-pitch is 4X contacted poly pitch (CPP).

According to an alternative embodiment, an integrated circuit structure is provided. The integrated circuit structure includes at least one static random-access memory (SRAM) cell. The SRAM cell includes a first active region, a second active region, a first pull-up transistor, a second pull-up transistor, a first isolation transistor, a second isolation transistor, a first pass-gate transistor, a second pass-gate transistor, a first pull-down transistor, a second pull-down transistor and a backside contact. The first active region follows a first routing direction. The second active region follows the first routing direction. The first pull-up transistor is formed upon the first active region. The second pull-up transistor is formed upon the first active region. The first isolation transistor is formed upon the first active region. The second isolation transistor is formed upon the first active region. The first pass-gate transistor is formed upon the second active region. The second pass-gate transistor is formed upon the second active region. The first pull-down transistor is formed upon the second active region. The second pull-down transistor is formed upon the second active region. The backside contact is extended to an outside area of the second active region. Each of the at least one SRAM cell has a Y-pitch along the first routing direction. The Y-pitch is 4X contacted poly pitch (CPP).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
    at least one static random-access memory (SRAM) cell, including:
        a first active region, following a first routing direction;
        a second active region, following the first routing direction;
        a first pull-up transistor, formed upon the first active region;
        a second pull-up transistor, formed upon the first active region;
        a first isolation transistor, formed upon the first active region;
        a second isolation transistor, formed upon the first active region;
        a first pass-gate transistor, formed upon the second active region;
        a second pass-gate transistor, formed upon the second active region;
        a first pull-down transistor, formed upon the second active region; and
        a second pull-down transistor, formed upon the second active region;
    wherein each of the at least one SRAM cell has a Y-pitch along the first routing direction, the Y-pitch is 4X contacted poly pitch (CPP).

2. The integrated circuit structure according to claim 1, wherein in each of the at least one SRAM cell, each of the first isolation transistor and the second isolation transistor includes a drain node, a source node and a gate node, the gate node of each of the first isolation transistor and the second isolation is electrically connected to a power supply voltage.

3. The integrated circuit structure according to claim 1, wherein each of the at least one SRAM cell includes:
    a first level front-side metal layer, including:
        a first power supply voltage conductor, located at a first boundary of the SRAM cell and shared with another adjacent SRAM cell, and electrically connected to a source node of the first pull-up transistor and a source node of the second pull-up transistor;
        a first common voltage conductor, electrically connected to a source node of the first pull-down transistor and a source node of the second pull-down transistor;
        a word-line landing line, located at a second boundary of the SRAM cell and shared with another adjacent SRAM cell, and electrically connected to a gate node of the first pass-gate transistor and a gate node of the second pass-gate transistor;
        a first local connection line, used to make an electrical connection among a drain node of the first pull-up transistor, a drain node of the first pull-down transistor, a drain node of the first pass-gate transistor, a gate node of the second pull-up transistor and a gate node of the second pull-down transistor; and
        a second local connection line, used to make an electrical connection among a drain node of the second pull-up transistor, a drain node of the second pull-down transistor, a drain node of the second pass-gate transistor, a gate node of the first pull-up transistor and a gate node of the first pull-down transistor;
    a second level front-side metal layer, located upon the first level front-side metal layer, including:
        a first word-line conductor, following a second routing direction substantially perpendicular to the first routing direction;
        a second word-line conductor, following the second routing direction; and
        a second common voltage conductor, following the second routing direction; and
    a third level front-side metal layer, located upon the second level front-side metal layer, including:
        a first bit-line conductor, electrically connected to a source node of the first pass-gate transistor.

4. The integrated circuit structure according to claim 3, wherein each of the at least one SRAM cell further includes:
    a fourth level front-side metal layer, including:
        a third word-line conductor, following the second routing direction substantially perpendicular to the first routing direction, and electrically connected to the first word-line conductor; and
        a fourth word-line conductor, following the second routing direction, and electrically connected to the second word-line conductor.

5. The integrated circuit structure according to claim 3, wherein each of the at least one SRAM cell further includes:
    a back-side metal layer, including:
        a second bit-line conductor, electrically connected to a source node of the second pass-gate transistor.

6. The integrated circuit structure according to claim 5, wherein the back-side metal layer further includes:
    a second power supply voltage conductor, electrically connected to the source node of the first pull-up transistor and the source node of the second pull-up transistor.

7. The integrated circuit structure according to claim 6, wherein the second bit-line conductor and the second power supply voltage conductor follow the first routing direction.

8. The integrated circuit structure according to claim 1, wherein each of the at least one SRAM cell is rectangular shaped and a ratio of an X-pitch to the Y-pitch is within a range of 0.7 to 1.5.

9. The integrated circuit structure according to claim 1, wherein the at least one SRAM cell includes two adjacent SRAM cells arranged in a second routing direction substantially perpendicular to the first routing direction, each of the SRAM cells includes a first word-line conductor and a second word-line conductor, the first word-line conductor is electrically connected to a gate node of the first pass-gate transistor and a gate node of the second pass-gate transistor of one of the SRAM cells, the second word-line conductor is electrically connected to a gate node of the first pass-gate transistor and a gate node of the second pass-gate transistor of another one of the SRAM cells.

10. The integrated circuit structure according to claim 1, further comprising:
at least one tap structure, located at an edge of an array of the at least one SRAM cell, and used to make an electrical connection among a back-side of the SRAM cell and a front-side of the SRAM cell.

11. An integrated circuit structure, comprising:
at least one static random-access memory (SRAM) cell, including:
a first active region, following a first routing direction;
a second active region, following the first routing direction;
a first pull-up transistor, formed upon the first active region;
a second pull-up transistor, formed upon the first active region;
a first isolation device, located adjacent to the first pull-up transistor and breaking the first active region;
a second isolation device, located adjacent to the second pull-up transistor and breaking the first active region;
a first pass-gate transistor, formed upon the second active region;
a second pass-gate transistor, formed upon the second active region;
a first pull-down transistor, formed upon the second active region; and
a second pull-down transistor, formed upon the second active region;
wherein each of the at least one SRAM cell has a Y-pitch along the first routing direction, the Y-pitch is more than 1X transistor gate pitch.

12. The integrated circuit structure according to claim 11, wherein the first isolation device has a dummy dielectric gate structure used for isolating the first pull-up transistor to another adjacent SRAM cell, and the second isolation device has a dummy dielectric gate structure used for isolating the second pull-up transistor to another adjacent SRAM cell.

13. The integrated circuit structure according to claim 11, wherein each of the at least one SRAM cell includes:
a first level front-side metal layer, including:
a first power supply voltage conductor, located at a first boundary of the SRAM cell and shared with another adjacent SRAM cell, and electrically connected to a source node of the first pull-up transistor and a source node of the second pull-up transistor;
a first common voltage conductor, electrically connected to a source node of the first pull-down transistor and a source node of the second pull-down transistor;
a word-line landing line, located at a second boundary of the SRAM cell and shared with another adjacent SRAM cell, and electrically connected to a gate node of the first pass-gate transistor and a gate node of the second pass-gate transistor;
a first local connection line, used to make an electrical connection among a drain node of the first pull-up transistor, a drain node of the first pull-down transistor, a drain node of the first pass-gate transistor, a gate node of the second pull-up transistor and a gate node of the second pull-down transistor; and
a second local connection line, used to make an electrical connection among a drain node of the second pull-up transistor, a drain node of the second pull-down transistor, a drain node of the second pass-gate transistor, a gate node of the first pull-up transistor and a gate node of the first pull-down transistor;
a second level front-side metal layer, located upon the first level front-side metal layer, including:
a first word-line conductor, following a second routing direction substantially perpendicular to the first routing direction;
a second word-line conductor, following the second routing direction; and
a second common voltage conductor, following the second routing direction; and
a third level front-side metal layer, located upon the second level front-side metal layer, including:
a first bit-line conductor, electrically connected to a source node of the first pass-gate transistor.

14. The integrated circuit structure according to claim 13, wherein each of the at least one SRAM cell further includes:
a fourth level front-side metal layer, including:
a third word-line conductor, following the second routing direction substantially perpendicular to the first routing direction, and electrically connected to the first word-line conductor; and
a fourth word-line conductor, following the second routing direction, and electrically connected to the second word-line conductor.

15. The integrated circuit structure according to claim 13, wherein each of the at least one SRAM cell further includes:
a back-side metal layer, including:
a second bit-line conductor, electrically connected to a source node of the second pass-gate transistor.

16. The integrated circuit structure according to claim 15, wherein the back-side metal layer further includes:
a second power supply voltage conductor, electrically connected to the source node of the first pull-up transistor and the source node of the second pull-up transistor.

17. The integrated circuit structure according to claim 16, wherein the second bit-line conductor and the second power supply voltage conductor follow the first routing direction.

18. The integrated circuit structure according to claim 11, wherein each of the at least one SRAM cell is rectangular shaped and a ratio of an X-pitch to the Y-pitch is within a range of 0.7 to 1.5.

19. The integrated circuit structure according to claim 11, wherein the at least one SRAM cell includes two adjacent SRAM cells arranged in a second routing direction substantially perpendicular to the first routing direction, each of the SRAM cells includes a first word-line conductor and a second word-line conductor, the first word-line conductor is electrically connected to a gate node of the first pass-gate transistor and a gate node of the second pass-gate transistor of one of the SRAM cells, the second word-line conductor is electrically connected to a gate node of the first pass-gate transistor and a gate node of the second pass-gate transistor of another one of the SRAM cells.

20. An integrated circuit structure, comprising:
   at least one static random-access memory (SRAM) cell, including:
   a first active region, following a first routing direction;
   a second active region, following the first routing direction;
   a first pull-up transistor, formed upon the first active region;
   a second pull-up transistor, formed upon the first active region;
   a first isolation transistor, formed upon the first active region;
   a second isolation transistor, formed upon the first active region;
   a first pass-gate transistor, formed upon the second active region;
   a second pass-gate transistor, formed upon the second active region;
   a first pull-down transistor, formed upon the second active region;
   a second pull-down transistor, formed upon the second active region; and
   a backside contact, extended to an outside area of the second active region;
   wherein each of the at least one SRAM cell has a Y-pitch along the first routing direction, the Y-pitch is more than 1X contacted poly pitch (CPP).

* * * * *